US008828297B2

(12) United States Patent
Sreenivasan et al.

(10) Patent No.: US 8,828,297 B2
(45) Date of Patent: Sep. 9, 2014

(54) PATTERNING OF NON-CONVEX SHAPED NANOSTRUCTURES

(75) Inventors: Sidlgata V. Sreenivasan, Austin, TX (US); Vikramjit Singh, Austin, TX (US); Frank Y. Xu, Round Rock, TX (US); Byung-Jin Choi, Austin, TX (US)

(73) Assignees: Molecular Imprints, Inc., Austin, TX (US); Board of Regents, The University of Texas System, Austin, TX (US)

( * ) Notice: Subject to any disclaimer, the term of this patent is extended or adjusted under 35 U.S.C. 154(b) by 78 days.

(21) Appl. No.: 13/290,770

(22) Filed: Nov. 7, 2011

(65) Prior Publication Data

US 2012/0112385 A1 May 10, 2012

Related U.S. Application Data

(60) Provisional application No. 61/410,592, filed on Nov. 5, 2010.

(51) Int. Cl.
*B82Y 40/00* (2011.01)
*G03F 7/00* (2006.01)

(52) U.S. Cl.
USPC .......................................................... 264/293

(58) Field of Classification Search
CPC .............................. G03F 7/0002; B82Y 40/00
USPC .......................................................... 264/293
See application file for complete search history.

(56) References Cited

U.S. PATENT DOCUMENTS

| 5,772,905 A | 6/1998 | Chou |
| 6,646,662 B1 | 11/2003 | Nebashi et al. |
| 6,696,220 B2 | 2/2004 | Bailey et al. |
| 6,753,130 B1 * | 6/2004 | Liu et al. ....................... 430/313 |
| 6,873,087 B1 | 3/2005 | Choi et al. |
| 6,900,881 B2 | 5/2005 | Sreenivasan et al. |
| 6,916,584 B2 | 7/2005 | Sreenivasan et al. |
| 6,919,152 B2 | 7/2005 | Sreenivasan et al. |
| 6,932,934 B2 | 8/2005 | Choi et al. |
| 6,936,194 B2 | 8/2005 | Watts et al. |
| 6,986,975 B2 | 1/2006 | Sreenivasan et al. |
| 7,027,156 B2 | 4/2006 | Watts et al. |
| 7,037,639 B2 | 5/2006 | Voisin |
| 7,070,405 B2 | 7/2006 | Sreenivasan et al. |

(Continued)

FOREIGN PATENT DOCUMENTS

| EP | 1860501 | 11/2007 |
| TW | 200809921 | 2/2007 |
| WO | 2008/060266 | 5/2008 |

OTHER PUBLICATIONS

Thompson et al. Fabrication of Step and Flash Imprint Lithography Templates Using Commercial Mask Processes, SPIE Microlithography Conference, Feb. 1, 2003.

(Continued)

*Primary Examiner* — Alison Hindenlang
(74) *Attorney, Agent, or Firm* — Cameron A. King

(57) ABSTRACT

Methods of making nano-scale structures with geometric cross-sections, including convex or non-convex cross-sections, are described. The approach may be used to directly pattern substrates and/or create imprint lithography templates or molds that may be subsequently used to directly replicate nano-shaped patterns into other substrates, such as into a functional or sacrificial resist to form functional nanoparticles.

16 Claims, 18 Drawing Sheets

(56) References Cited

U.S. PATENT DOCUMENTS

| | | | |
|---|---|---|---|
| 7,077,992 B2 | 7/2006 | Sreenivasan et al. |
| 7,136,150 B2 | 11/2006 | Sreenivasan et al. |
| 7,157,036 B2 | 1/2007 | Choi et al. |
| 7,179,396 B2 | 2/2007 | Sreenivasan |
| 7,186,656 B2 | 3/2007 | Sreenivasan |
| 7,229,273 B2 | 6/2007 | Bailey et al. |
| 7,252,777 B2 | 8/2007 | Vidusek et al. |
| 7,261,831 B2 | 8/2007 | Sreenivasan |
| 7,281,921 B2 | 10/2007 | Watts et al. |
| 7,309,225 B2 | 12/2007 | McMackin et al. |
| 7,396,475 B2 | 7/2008 | Sreenivasan |
| 7,699,598 B2 | 4/2010 | Sreenivasan et al. |
| 7,759,253 B2 | 7/2010 | Chang |
| 7,780,893 B2 | 8/2010 | Sreenivasan et al. |
| 7,785,526 B2 | 8/2010 | Voisin |
| 2003/0189273 A1 | 10/2003 | Olsson |
| 2004/0065252 A1 | 4/2004 | Sreenivasan et al. |
| 2004/0065976 A1 | 4/2004 | Sreenivasan et al. |
| 2004/0188381 A1 | 9/2004 | Sreenivasan et al. |
| 2005/0064344 A1 | 3/2005 | Bailey et al. |
| 2005/0084804 A1 | 4/2005 | Truskett et al. |
| 2005/0187339 A1 | 8/2005 | Xu et al. |
| 2005/0189676 A1 | 9/2005 | Sreenivasan |
| 2005/0230882 A1 | 10/2005 | Watts et al. |
| 2005/0260848 A1 | 11/2005 | Sreenivasan |
| 2005/0285308 A1 | 12/2005 | Hattori et al. |
| 2006/0063277 A1 | 3/2006 | Vidusek et al. |
| 2006/0113697 A1 | 6/2006 | Sreenivasan |
| 2007/0212494 A1 | 9/2007 | Xu et al. |
| 2007/0231981 A1 | 10/2007 | Sreenivasan et al. |
| 2008/0032508 A1* | 2/2008 | Chang .......................... 438/725 |
| 2008/0095878 A1 | 4/2008 | Bailey et al. |
| 2008/0118872 A1 | 5/2008 | Sreenivasan |
| 2009/0029191 A1 | 1/2009 | Albrecht |
| 2009/0078673 A1 | 3/2009 | Kihara et al. |
| 2009/0130598 A1 | 5/2009 | Schmid et al. |
| 2009/0148619 A1 | 6/2009 | LaBrake et al. |
| 2009/0166933 A1 | 7/2009 | Sreenivasan |
| 2009/0212012 A1 | 8/2009 | Brooks et al. |
| 2009/0308837 A1 | 12/2009 | Albrecht et al. |
| 2010/0003473 A1 | 1/2010 | Nishmaki |
| 2010/0015270 A1 | 1/2010 | Choi et al. |
| 2010/0095862 A1 | 4/2010 | Miller et al. |
| 2010/0102029 A1 | 4/2010 | Schmid et al. |
| 2010/0109194 A1 | 5/2010 | Miller et al. |
| 2010/0112310 A1 | 5/2010 | Truskett et al. |
| 2010/0120251 A1 | 5/2010 | Sreenivasan et al. |
| 2010/0270651 A1 | 10/2010 | Li et al. |
| 2011/0049096 A1 | 3/2011 | Sreenivasan et al. |
| 2012/0114559 A1 | 5/2012 | Singh et al. |

OTHER PUBLICATIONS

Guo, Recent progress in nanoimprint technology and its applications, J. Phys. D: Appl. Phys. 37 pp. R123-R141, May 12, 2004.

* cited by examiner

PATTERNING OF NON-CONVEX SHAPED NANOSTRUCTURES

CROSS REFERENCE TO RELATED APPLICATIONS

The present application claims priority to U.S. provisional application No. 61/410,592 filed Nov. 5, 2010, which is hereby incorporated by reference.

BACKGROUND

Nano-fabrication involves the fabrication of very small structures, e.g., having features on the order of 100 nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, energy systems and the like.

An exemplary nano-fabrication technique is referred to as imprint lithography. Exemplary imprint lithography processes are described in detail in numerous publications, such as U.S. patent application publication 2004/0065976, U.S. patent application publication 2004/0065252, and U.S. Pat. No. 6,936,194, all of which are assigned to an assignee of the present invention.

An imprint lithography technique disclosed in each of the aforementioned U.S. patent application publications and U.S. patent includes formation of a relief pattern in a formable liquid (polymerizable layer) and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

Many nano-patterning applications take advantage of the size and uniform shape of nano-scale features to achieve a desired result. Many processes employed to make nano-patterns use a bottom-up "growth" process to grow a particular type and size of nano-patterns based on chemistry. Unfortunately, these types of processes may be slow and prone to producing nano-patterns whose size and shape may be insufficiently controlled to produce desired performance cost effectively. Thus there remains a need for processes that provide for better control of the processed sizes and shapes of nano-scale structures.

SUMMARY OF THE INVENTION

The present invention meets these and other needs and is directed towards making nano-scale structures with geometric cross-sections using top-down patterning processes, such as electron beam lithography, photolithography or imprint lithography. Such cross-sectional geometries can be convex or non-convex. Non-convex cross-section shaped nano structures, in particular, can be valuable as they can provide very high ratios of surface perimeter to cross-sectional area, which in turn can provide very high ratios of surface area to volume in a formed nanostructure. Aspects of the invention includes making templates for imprint lithography that requires two or more steps of a top-down patterning process that are carefully aligned, and the use of these templates in an imprint lithography process to subsequently transfer the geometric shape, including non-convex shapes, into a functional or sacrificial resist, and forming e.g., functional nanoparticles therefrom.

DESCRIPTION OF THE DRAWINGS

FIGS. 20A-24B illustrates top and cross-section views showing imprint of exemplary raised non-convex geometrically shaped nanostructures in formable material using imprint mold with recessed non-convex geometrically shaped nanostructures and etch pattern transfer into the metal layer.

FIGS. 23A-24B illustrate cross-section and top views showing etch pattern transfer into substrate to form raised non-convex geometrically shaped nanostructures in the substrate.

FIG. 7A illustrates a simplified cross-sectional view of a nano-pattern mold positioned above a substrate.

FIG. 33B illustrates a simplified perspective view of a nano-pattern structure formed on a substrate.

DETAILED DESCRIPTION

Figure 1:
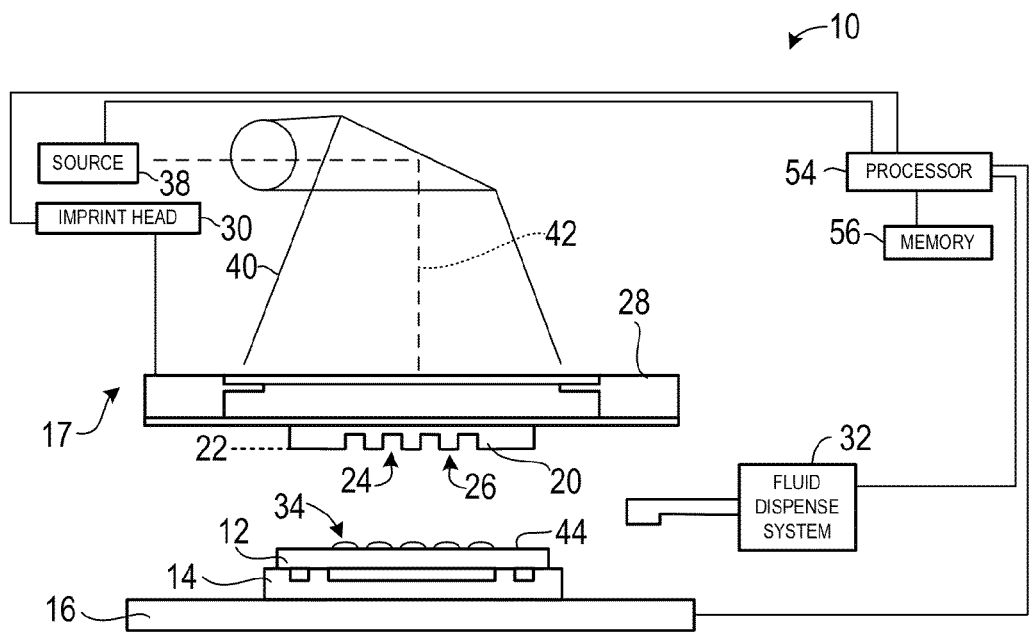
FIG. 1 illustrates a system suitable to form a relief pattern on a substrate according to embodiments herein.

Referring to FIG. 1, a system 10 to form a relief pattern on a substrate 12 is shown. Substrate 12 may be coupled to a substrate chuck 14. As shown substrate chuck 14 is a vacuum chuck, however, substrate chuck 14 may be any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes," which is incorporated herein by reference. Substrate 12 and substrate chuck 14 may be supported upon a stage 16. Further, stage 16, substrate 12, and substrate chuck 14 may be positioned on a base (not shown). Stage 16 may provide motion along the x, y, and z axes.

Spaced-apart from substrate 12 is a master patterning device 17. Master patterning device 17 comprises a template 28 having a mesa 20 extending therefrom towards substrate 12 with a patterning surface 22 thereon. Further, mesa 20 may be referred to as a mold 20. Mesa 20 may also be referred to as a nano-imprint mold 20. In a further embodiment, template 28 may be substantially absent of mold 20. In still a further embodiment, mold 20 may be integrally formed with template 28. Template 28 and/or mold 20 may be formed from such materials including, but not limited to, fused-silica, quartz, silicon, organic polymers, siloxane polymers, borosilicate glass, fluorocarbon polymers, metal, and hardened sapphire. As shown, patterning surface 22 comprises features defined by a plurality of spaced-apart recesses 24 and protrusions 26. However, in a further embodiment, patterning surface 22 may be substantially smooth and/or planar. Patterning surface 22 may define an original pattern that forms the basis of a pattern to be formed on substrate 12. Master patterning device 17 may be formed employing electron beam (e-beam) lithography.

Master patterning device 17 may be coupled to a chuck 28, chuck 28 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes." Further, chuck 28 may be coupled to an imprint head 30 to facilitate movement of master patterning device 17.

System 10 further comprises a fluid dispense system 32. Fluid dispense system 32 may be in fluid communication with substrate 12 so as to deposit polymerizable material 34 thereon. System 10 may comprise any number of fluid dispensers, and fluid dispense system 32 may comprise a plurality of dispensing units therein. Polymerizable material 34 may be positioned upon substrate 12 using any known technique, e.g., drop dispense, spin-coating, dip coating, chemical vapor deposition (CVD), physical vapor deposition (PVD), thin film deposition, thick film deposition, and the like. Typically, polymerizable material 34 is disposed upon substrate 12 before the desired volume is defined between mold 20 and substrate 12. However, polymerizable material 34 may fill the volume after the desired volume has been obtained.

Polymerizable material 34 may comprise a solvent based monomer or a spin-on material. Further, polymerizable material 34 may comprise a monomer mixture as described in U.S. Pat. No. 7,157,036 entitled "Method to Reduce Adhesion Between a Conformable Region and a Pattern of a Mold" and United States patent application publication 2005/0187339 entitled "Materials for Imprint Lithography," both of which are incorporated herein by reference.

System 10 further comprises a source 38 of energy 40 coupled to direct energy 40 along a path 42. Imprint head 30 and stage 16 are configured to arrange master patterning device 17 and substrate 12, respectively, to be in superimposition and disposed in path 42. System 10 may be regulated by a processor 54 that is in data communication with stage 16, imprint head 30, fluid dispense system 32, and source 38, operating on a computer readable program stored in memory 56.

The above-mentioned system and process may be further employed in imprint lithography processes and systems referred to in U.S. Pat. No. 6,932,934, U.S. Pat. No. 7,077,992, U.S. Pat. No. 6,900,881, United States patent application publication 2004/0124566, United States patent application publication 2004/0188381, and United States patent application publication 2004/0211754, all of which are incorporated by reference herein. In a further embodiment, the above-mentioned relief pattern may be created by any known technique, e.g., photolithography (various wavelengths including G line, I line, 248 nm, 193 nm, 157 nm, and 13.2-13.4 nm), contact lithography, e-beam lithography, x-ray lithography, ion-beam lithography and atomic beam lithography. For example, the above-mentioned relief pattern may be created using techniques described in U.S. Pat. No. 5,772,905, which is hereby incorporated by reference.

Nano-structures with varying geometric cross-sections may be fabricated using techniques described herein. Generally, this process may include two phases. In Phase 1, a combination of multiple lithographic steps may be used to create an imprint template with convex geometric shaped cross-sections (referred to here as nano-shaped templates).

The multiple lithographic steps may use one or more kinds of lithography processes such as electron beam, imprint lithography or photolithography. Such a nano-shaped template is directly useful for fabricating convex nano-structures. Alternatively, in Phase 2, the nano-shaped template may be used in conjunction with an imprint lithography process to create an imprint template with non-convex geometric cross sections, which can then be used in fabricating non-convex nano-structures.

Phase 1: Formation of Nano-Shaped Convex Template

Generally, Phase 1 may comprise multiple process steps. For simplification in description, the formation of the nano-shaped template is described herein using imprint lithography. However, it should be noted that the patterning steps may use photolithography, electron beam lithography, and the like.

In one embodiment, a thin layer of first material (e.g., non wet-strippable material), including polymers, dielectrics, metals, etc., may be deposited on a desired substrate made of a nano structure material. A layer of second resist (e.g., wet strippable material) may be deposited over the first material. The second resist may be selectively wet-stripped with the first material substantially remaining intact. A formable imprint lithography material may be deposited over the second resist material and the lithography material may be imprinted to form a relief pattern. The mold used to create the relief pattern using imprinting may be comprised of simple geometries formable from an e-beam process (e.g., lines, dots, holes, and the like). An optional adhesion material may be deposited between the second resist material and the third formable material to facilitate adhesion of the formable material to the underlying substrate. Adhesive layer may be formed of adhesion materials as further described in U.S. Publication No. 2007/0212494, which is hereby incorporated by reference. The relief pattern in the formable layer may be optionally etched to produce raised patterns of formable material, wherein the raised patterns have a smaller size as compared to the size prior to the etch.

An overcoat material may be deposited over the etched formable layer. Overcoat material may be blanket etched to expose a top surface of the thin raised lines. The exposed formable material may be etched to form trenches extending down to the non wet strippable first resist material. Non wet-strippable resist may be dry etched stopping when the substrate is reached. The formable layer material and the wet strippable material may be stripped leaving the non wet-strippable material with trenches extending down to the substrate. The substrate may be etched down to a desired depth if a pattern in the surface is final. Finally, the imprint mold may be modified in form and/or orientation and the process is repeated from step 2 if the pattern in the surface is not final.

Figure 2A:
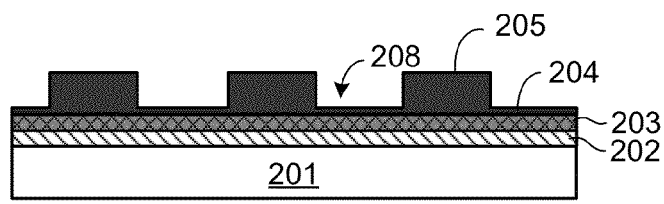
FIGS. 2A-2C illustrate cross-section views showing material layers after processing according to embodiments herein.

FIGS. 2A-4B illustrate an exemplary formation of a nano-shaped template having nano-patterned structures. FIG. 2A illustrates a cross-section view of a substrate 201 with resist layer 202 (e.g., a non wet-strippable) and resist layer 203 (e.g., a wet strippable) disposed over layer 202. A formable material 204 may be deposited over the two resist layers and imprinted to form exemplary features (e.g., lines) 205 with spaces 208, that may be of equal dimensions using system and methods described in relation to FIG. 1.

Figure 2B:
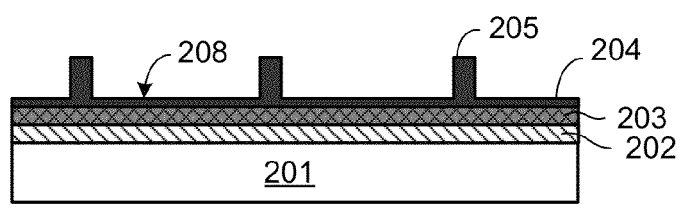

FIG. 2B illustrates a cross-section view of the multiplayer structure of FIG. 2A after the formable material 204 has been etched thereby thinning features 205 to form features that have a high aspect ratio of height to width. Substrate 201, resist layer 202 and resist layer 203 are also visible in this view.

Figure 2C:
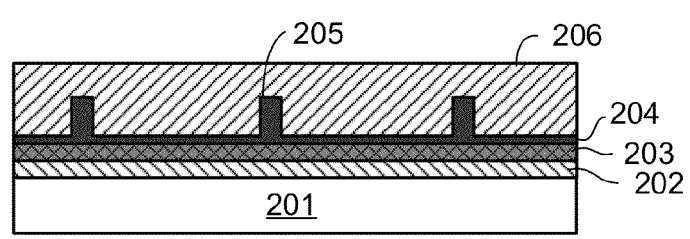

FIG. 2C illustrates a cross-section view of the multi-layer structure of FIG. 2B after an overcoat layer 206 has been applied over the surface to a height above the features 205. This overcoat layer may be a silicon-containing polymer similar to the disclosure in the U.S. Pat. No. 7,186,656, which is hereby incorporated by reference. Substrate 201, resist layer 202, and resist layer 203 are again visible in this view.

Figure 3A:
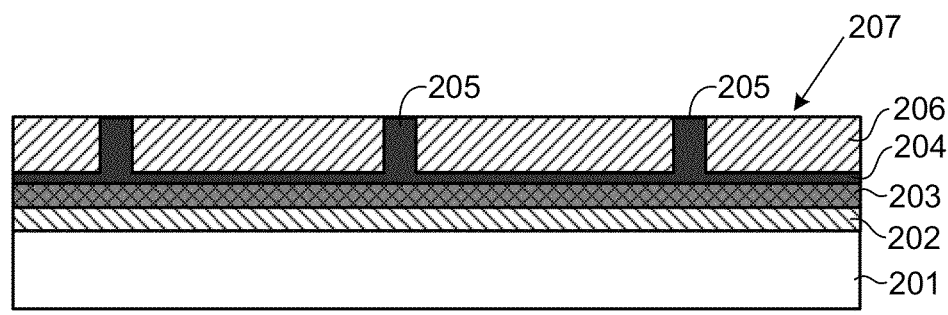
FIGS. 3A-3C illustrate cross-section views showing material layers after further processing according to embodiments herein.

FIG. 3A illustrates a cross-section view of the structure of FIG. 2C after overcoat layer 206 has been planarized to expose the tops of the features 205 above surface 207. Substrate 201, resist layer 202, resist layer 203, and overcoat layer 206 are visible in this view.

Figure 3B:
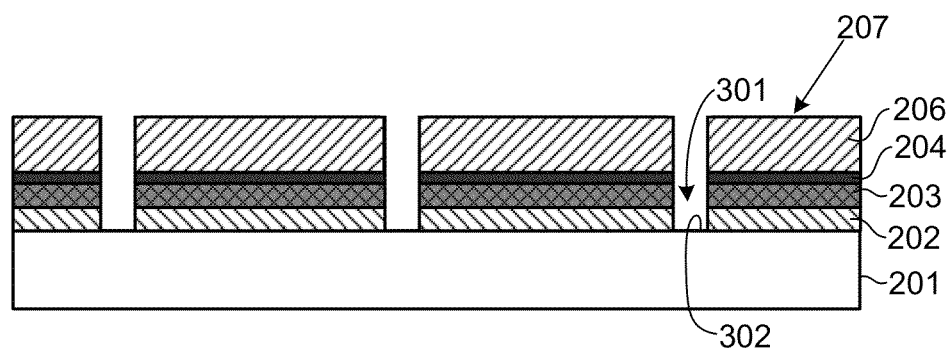

FIG. 3B illustrates a cross-section view of the structure of FIG. 3A after the formable material 204 has been etched through to resist layer 203. Further, non wet etching (e.g., with $O_2$) removes resist layer 202 in the trenches stopping at substrate 201. Substrate 201, resist layer 202, resist layer 203, formable layer 204, and overcoat layer 206 are visible in this view. Channel 301 may be formed when features 205 are etched. Further, removal of the layers 202-204 in channel 301 may extend channel depth 302 to a surface of substrate 201.

Figure 3C:
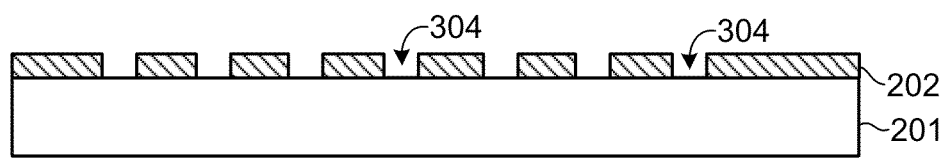

FIG. 3C illustrates a cross-section view of the structure in FIG. 3B after overcoat layer 206, formable material 204, and resist layer 203 have been stripped leaving only the resist layer 202 with grooves 304 to the substrate 201. Forming nano-patterns or surface features of a particular shape may be provided by repeating the process steps of FIG. 2A-FIG. 3C until a desired surface pattern corresponding to the desired nanostructure(s) has been achieved.

Figure 4A:
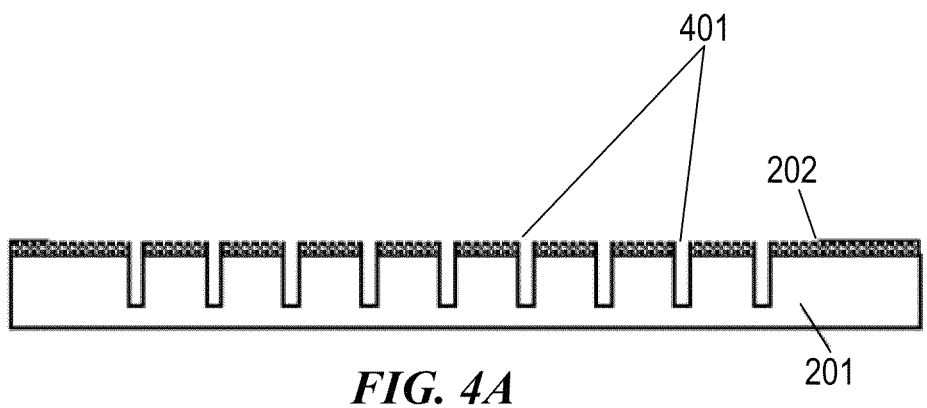
FIG. 4A illustrates a cross-section view showing trenches etched into the substrate according to embodiments herein.
Figure 4B:
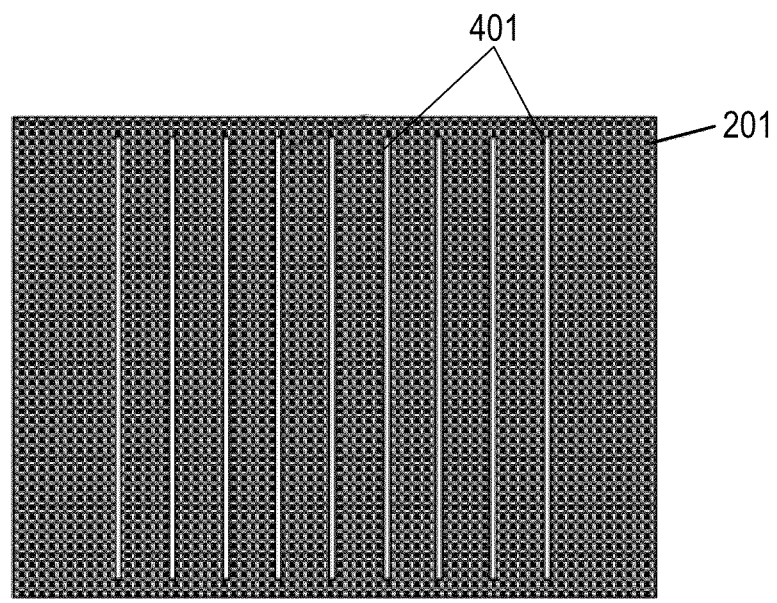
FIG. 4B illustrates a top view of the trenches of FIG. 4A.

FIG. 4A illustrates a cross-section view of the exemplary pattern of FIG. 3C etched to a particular depth forming grooves 401. Substrate 201 and resist layer 202 are visible in this view. FIG. 4B illustrates a top view of grooves 401 in substrate 201.

Figure 5A:
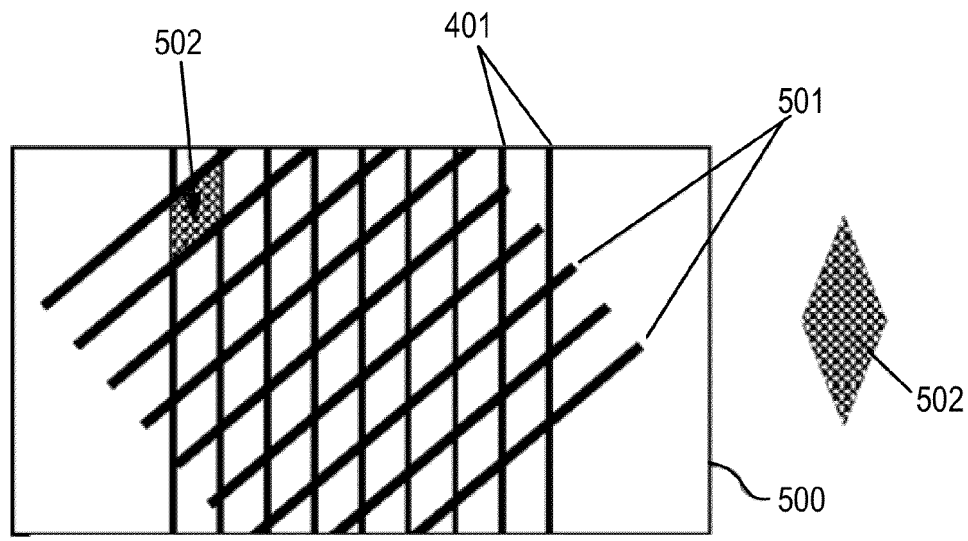
FIG. 5A illustrates a top view of an exemplary patterned surface having raised convex nano-structures formed by etching trenches formed by a first pattern and a second pattern.

FIG. 5A illustrates a top view of the substrate 201 after processing with a first pattern 501 using process steps of FIGS. 2A-4B. A rhombus shaped surface pattern 502 may thereby be formed using this process sequence. The trenches and surface pattern 502 may be used to increase the surface area of structure 500.

Figure 5B:
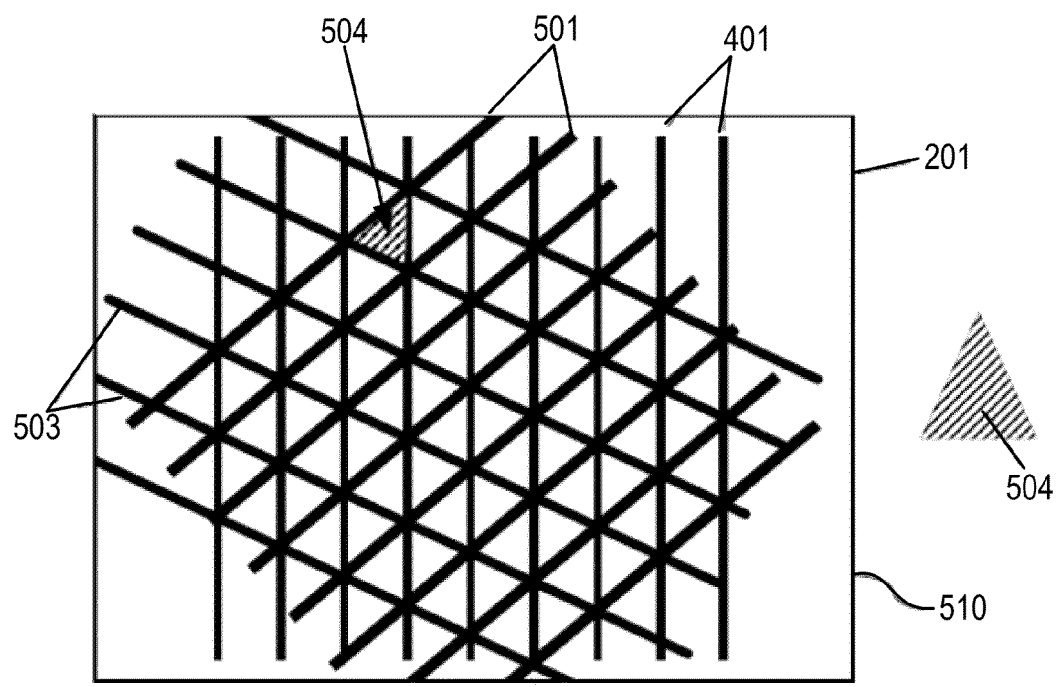
FIG. 5B illustrates a top view of another exemplary patterned surface having raised convex nano-structures formed by etching trenches formed by a first pattern and additional overlaying patterns.

FIG. 5B illustrates a top view of the substrate 201 after processing with an additional overlayed pattern 503 using process steps of FIGS. 2A-4B. A triangular shaped surface pattern 504 may thereby be formed using this process sequence. The trenches and the surface pattern 504 may be used to increase the surface area of structure 510. In another embodiment, the trenches are etched through thereby producing uniform nano-shaped patterns that have the triangular cross-section and a length corresponding to the substrate thickness. The surface patterns of structures 500 and 510 can form the patterning surface of an imprint template, with features having convex cross-sectional areas, as depicted.

Figure 6:
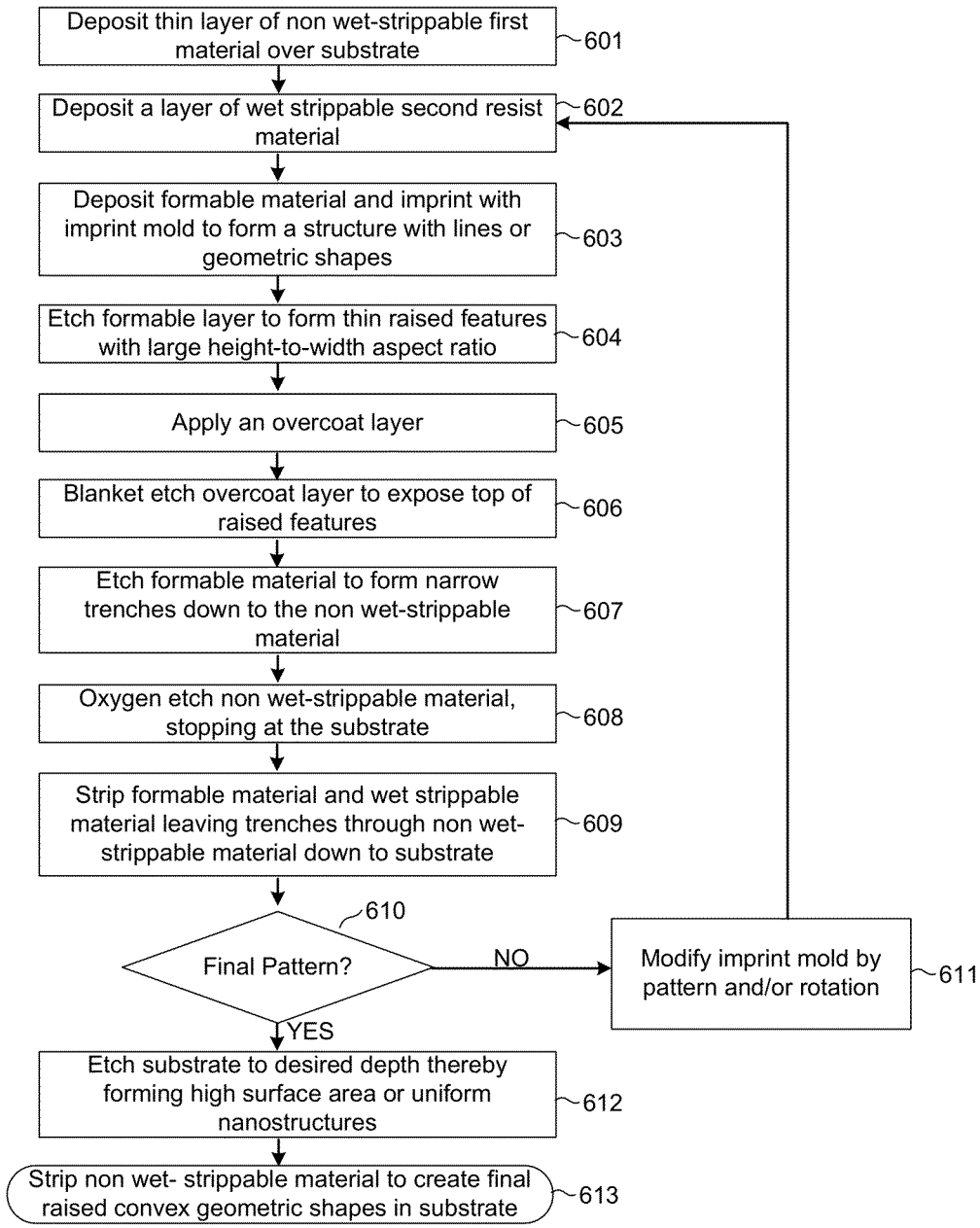
FIG. 6 illustrates a flow diagram of an exemplary process for forming raised convex nanostructures on a substrate according to embodiments herein.

FIG. 6 is a flow diagram of process steps for formation of an exemplary nano-shaped template having nano-shaped structures, such as the those depicted in FIGS. 5A and 5B. In step 601, a thin layer of first resist may be deposited on a substrate. In step 602, an overlay of second resist may be deposited. For example, second resist may include a wet strippable material, a soluble material, such as PMGI (Polymethylglutarimide), and/or the like. PMGI may be wet-stripped by tetramethylammonium hydroxide (TMAH) that may be obtained under the trade name CD260 from Shipley Company, L.L.C. (now Rohm Haas). Alternatively, the second resist may be any negative photoresist, for example poly hydroxyl styrene. Each resist layer may include an intermediate layer for adhesion purposes such as the material disclosed in U.S. Publication No. 2007/0212494. In step 603, a layer of formable material may be deposited and imprinted with an imprint mold to form a third resist layer that has relief patterns of raised patterns separated by depressions as spaces. In one embodiment, the width of the raised patterns and spaces are equal. In step 604, the relief pattern may be etched forming smaller raised patterns with a large height to width ratio. In step 605, an overcoat of silicon-containing organic material may be applied to cover the raised lines. In one embodiment, overcoat layer may be a silicon-containing polymer similar to the disclosure in the U.S. Pat. No. 7,186,656. In step 606, a blanket etch may expose the top surface of the raised lines. In step 607, the formable material may be etched to form trenches down to the first resist material, which responds to a different etch chemistry. In step 608, the first resist material may be dry etched (e.g., with oxygen) stopping at the substrate. In step 609, the formable material and the second resist may be stripped leaving trenches through the first resist down to the substrate. In step 610, a decision may be made if the pattern formed in the surface of the substrate is the final pattern. If the decision is NO, then in step 611, the imprint mold may be modified either by an overlaying pattern, alterations to the current pattern, and/or rotation of an existing pattern. For example, a branch may be taken back to step 602 wherein some of the process steps may be repeated forming a second pattern overlaying the first pattern in the substrate. If the decision in step 610 is YES, then in step 612, the substrate may be etched through the patterned first resist layer to a desired depth thereby forming a shaped nano-structure on the substrate. In step 613, the first resist material may be stripped away.

In another embodiment, FIG. 6 may involve using a metal film (such as chromium). For example, the metal film may be included in Step 601. Step 602 may be eliminated. Steps 604-608 may be as is in FIG. 6. However, step 609 may be replaced by a halogen and $O_2$ plasma ashing processes to remove all the organic materials leaving behind the etched pattern in the metal film. This process may be repeated as many times as needed to create nano-shapes. Additionally, an optional adhesion layer (described earlier) may be used just prior to the imprinting step in Step 603.

In another embodiment of the process of FIG. 6, Steps 604-606 may be eliminated and the formable imprinted material of Step 603 may be directly etched into materials put down in earlier steps (whether it is a wet strippable second material and a non wet-strippable first material or a metal film such as chromium used without the wet strippable material). This embodiment leads to patterns that have the opposite tone of the patterns obtained in the process steps 603-606 in FIG. 6.

In another embodiment of the process of FIG. 6, Steps 601 and 602 may be eliminated and a metal film (e.g., chromium) may be deposited on the substrate. Formable material of Step 603 may be imprinted and etched, however, the pattern may be etched directly into the substrate. Steps 605-608 may be eliminated and formable material stripped leaving trenches in the metal film and the substrate. The process may then be repeated as many times as needed to create desired nano-shapes.

The processes described above, and as further described herein, may result in a substrate with shaped nano-structures which are valuable in many applications, including within the bio-realm. For example, material forming nano-structures may be formed of material providing a dosage of medication and/or therapy or nano-structures may be formed of material housing a dosage of medication and/or therapy depending on design considerations. Formation of nano-structures through methods described herein provides precision control of size and shape. Such precision may provide targeted delivery and/or release formulations in a controlled manner.

Nano-structures other than those shown may be produced by the method described herein and are considered within the scope of the present invention. Additionally, elements of process systems and methods disclosed in U.S. Pat. No. 7,186,656, U.S. Pat. No. 7,252,777, and U.S. Pat. No. 7,261,831, may be used to aid in formation of nano-structures, all of which are hereby incorporated by reference in their entirety.

The above detailed description describes a process where nano-patterns for a final product or for fabricating an imprint mold may be realized. For certain nano-patterns, it may not be practical to directly create a mold using a typical e-beam process. In this case, and as further detailed herein, the disclosed processes may be used to create a first imprint mold that has desired nano-patterns, including convex patterns, with desired sharp corners or edges. This first imprint mold may then be used to repeatedly pattern a new substrate to create more complex nano-patterns, including non-convex patterns, again with the desired sharp corners or edges. Once the desired complex nano-patterns are achieved on the new substrate, it in turn may be used in a step and repeat process to fabricate a large area imprint mold that now is able to produce nano structures of desired shape complexity, including non-convex cross-sectional shapes.

Figure 7:
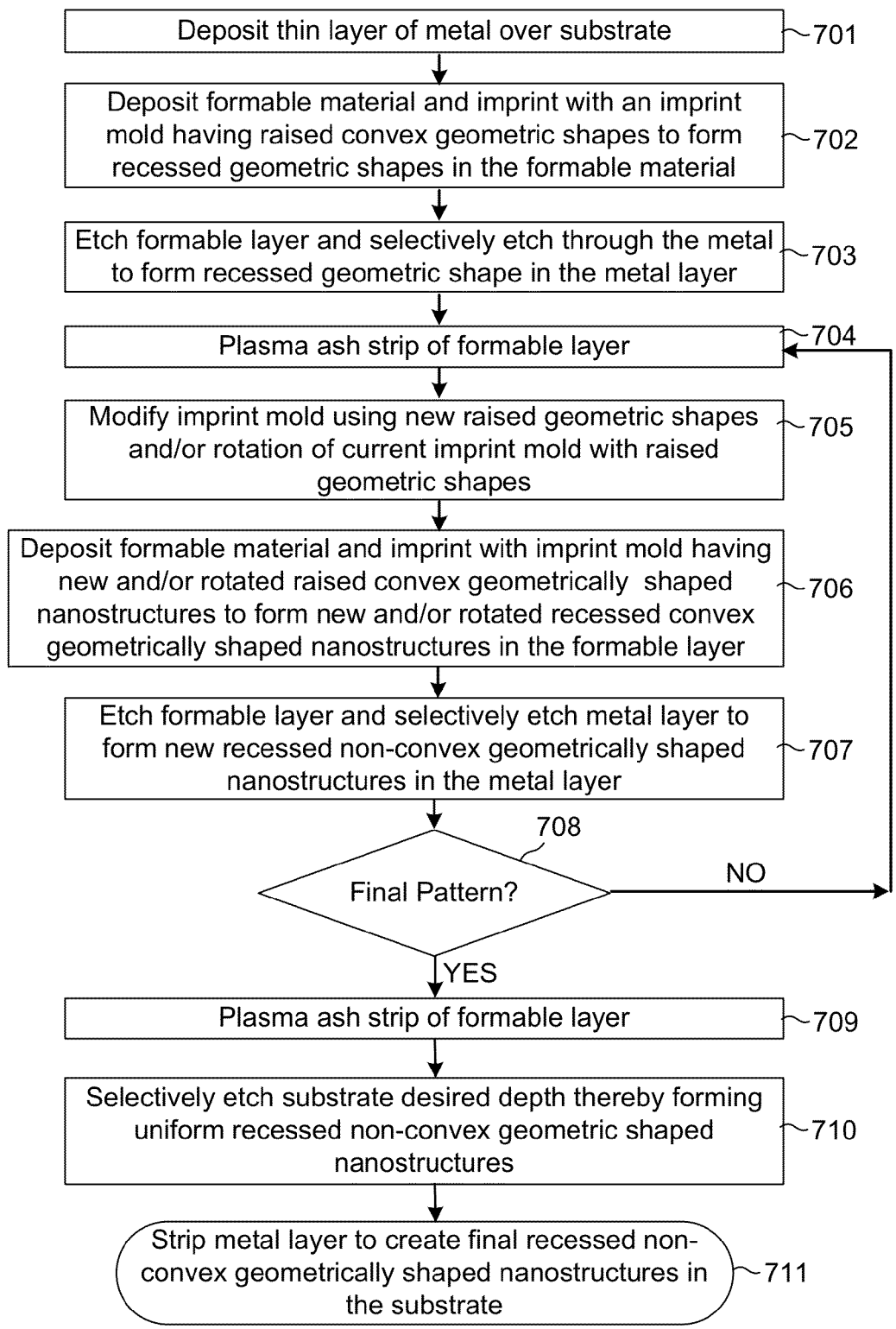
FIG. 7 illustrates a flow diagram of an exemplary process for forming recessed non-convex nanostructures in a substrate according to embodiments herein.
Figure 10A:
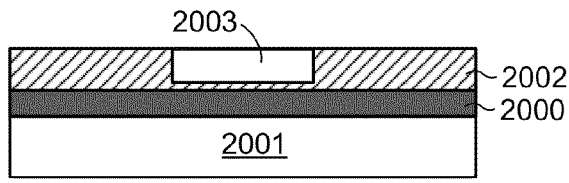
FIGS. 10A-12B illustrate cross-section and top down views showing imprint of exemplary recessed convex geometrically shaped nanostructures in formable material using imprint mold with raised convex geometrically shaped nanostructures and etched pattern transfer into the metal layer.
Figure 10B:
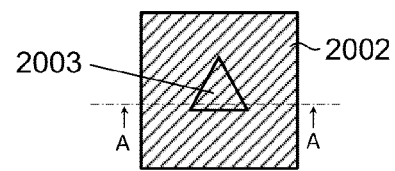
Figure 11A:
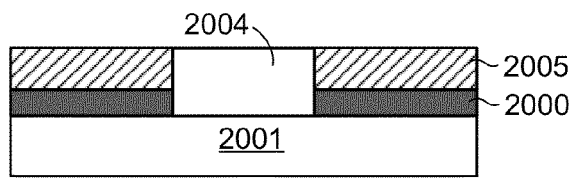
Figure 11B:
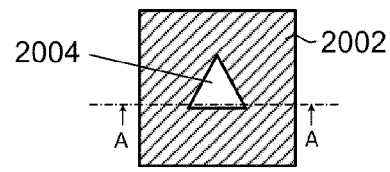
Figure 12A:
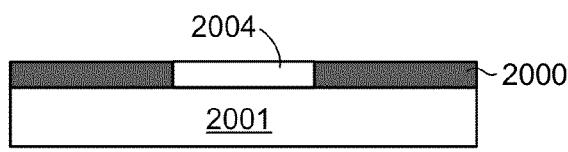
Figure 12B:
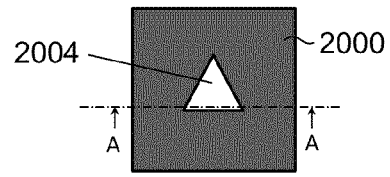

Phase 2: Formation of Nano-Shape Non-Convex Template:

FIG. 7 is a flow diagram of process steps for formation of an exemplary recessed non-convex geometrically shaped nanostructure. FIGS. 9-17 further illustrate such an exemplary process. In step 701, a thin layer of metal layer 2000 is be deposited on a substrate 2001, shown in FIG. 9. For example, metal layer may contain chromium and the substrate may consist of 1 uartz. Other suitable materials having hard mask characteristics may used for layer 2000 in combination with the same or other substrate materials. In step 702, a first layer of formable (polymerizable) material 2002 may be deposited and imprinted with an imprint template having raised convex geometrically shaped nanostructures (such as those depicted in FIGS. 5A and 5B) to form recessed convex geometrically shaped nanostructure 2003 in the formable material 2002 with very thin residual layer, as shown in FIGS. 10A and 10B. In step 703, the formable layer 2002 is removed from formed recesses 2003 using, for example, a dry etch step (e.g. Oxygen gas, or Argon with Oxygen gas plasma) to expose the metal layer 2000 and where the metal layer 2000 is selectively etched using a second etch step (e.g. Chlorine gas or Chlorine with Oxygen gas plasma) to form recessed convex geometrically shaped nanostructures 2004 in the metal layer 2000, as shown in FIGS. 11A and 11B. A single etch step may be used to etch the formable layer 2002 and metal layer 2000 to form the recess 2004 in the metal layer 2000. In step 704, remaining formable layer 2002 may be removed using a plasma ashing step (e.g. using Oxygen gas plasma), as shown in FIGS. 12A and 12B.

Figure 13A:
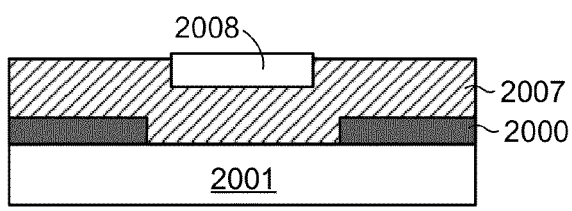
FIGS. 13A-15B illustrate top and cross-section views showing a second imprint of exemplary recessed convex geometrically shaped nanostructures in formable material using a new or rotated imprint mold containing raised convex geometrically shaped nanostructures and etched pattern transfer into the metal layer.
Figure 13B:
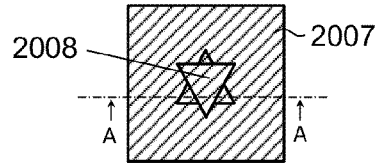
Figure 14A:
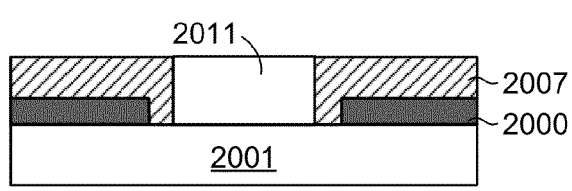
Figure 14B:
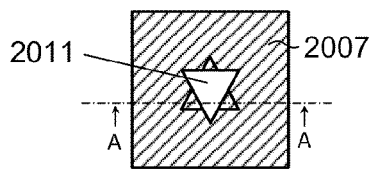
Figure 15A:
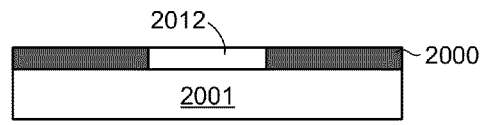
Figure 15B:
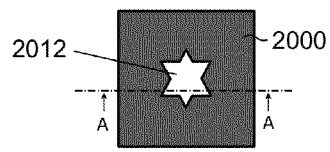
Figure 16A:
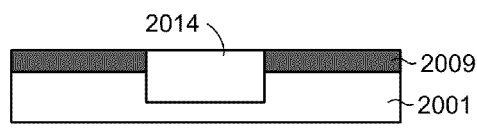
FIGS. 16A-17B illustrate cross-section and top down view showing etch pattern transfer into substrate to form recessed non-convex geometrically shaped nanostructures in the substrate.
Figure 16B:
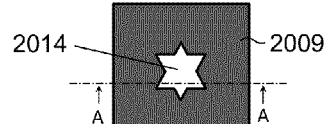
Figure 17A:
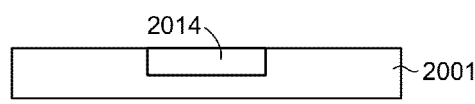
FIG. 17C illustrates an enlarged view of the recessed non-convex geometrically shaped nanostructure of FIG. 17B.
FIG. 17D illustrates a perspective isometric view of recessed non-convex geometrically shaped nanostructures in the substrate.
Figure 17B:
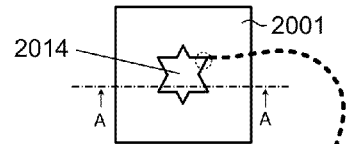
Figure 17D:
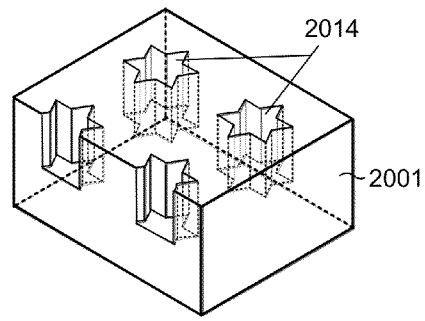
Figure 17C:
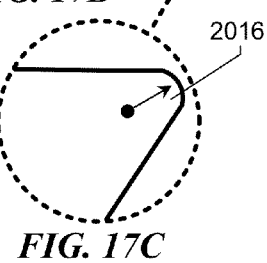
Figure 18A:
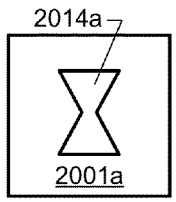
FIGS. 18A-18E illustrates additional exemplary recessed non-convex nanostructures created in a substrate according to embodiments herein.
Figure 18B:
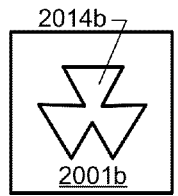
Figure 18C:
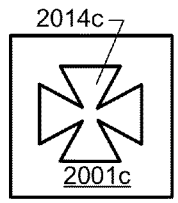
Figure 18D:
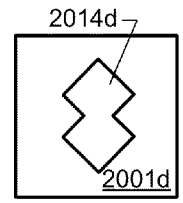
Figure 18E:
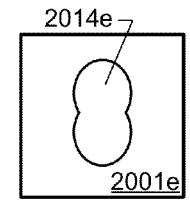
Figure 29:
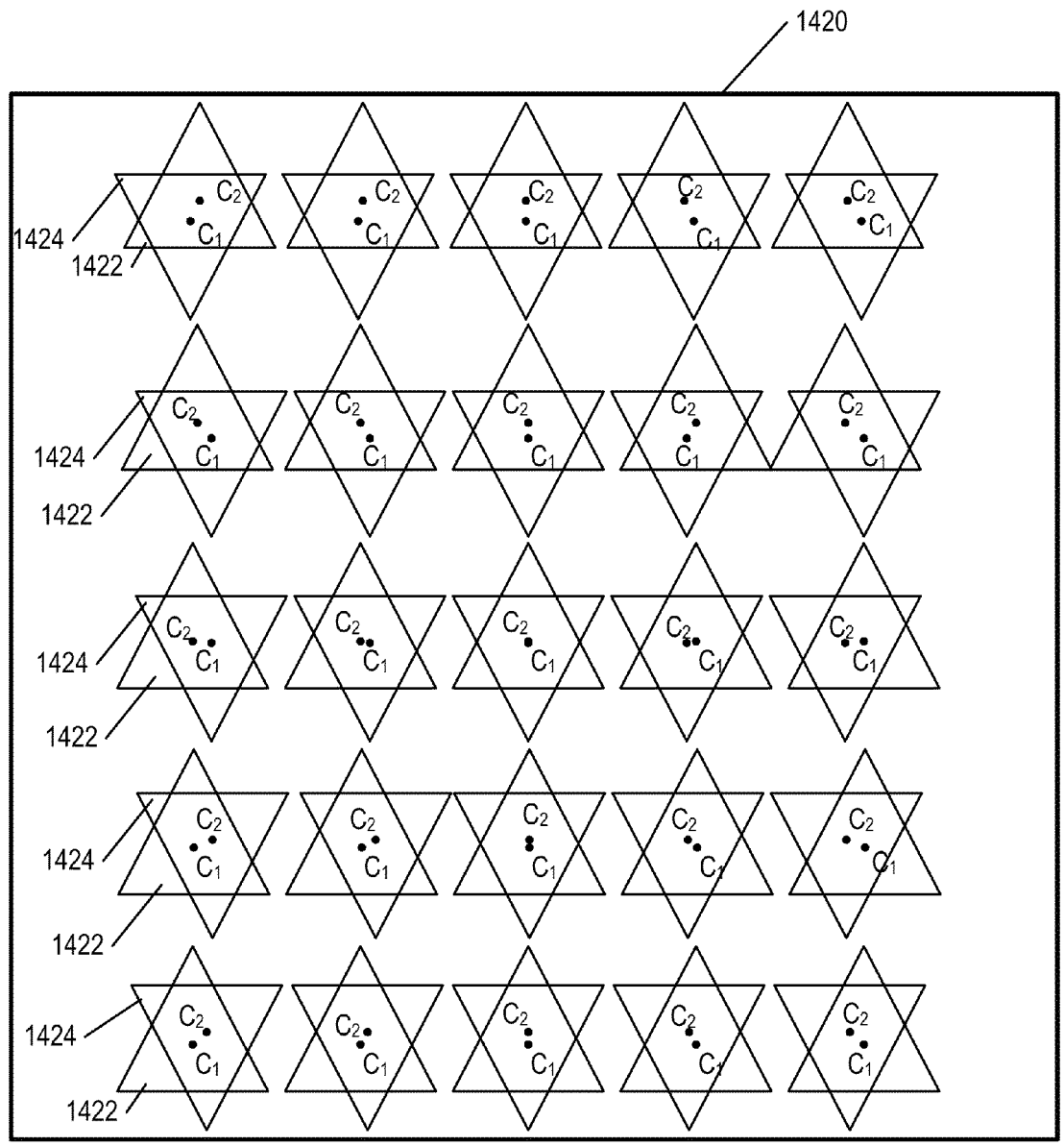
Figure 30:
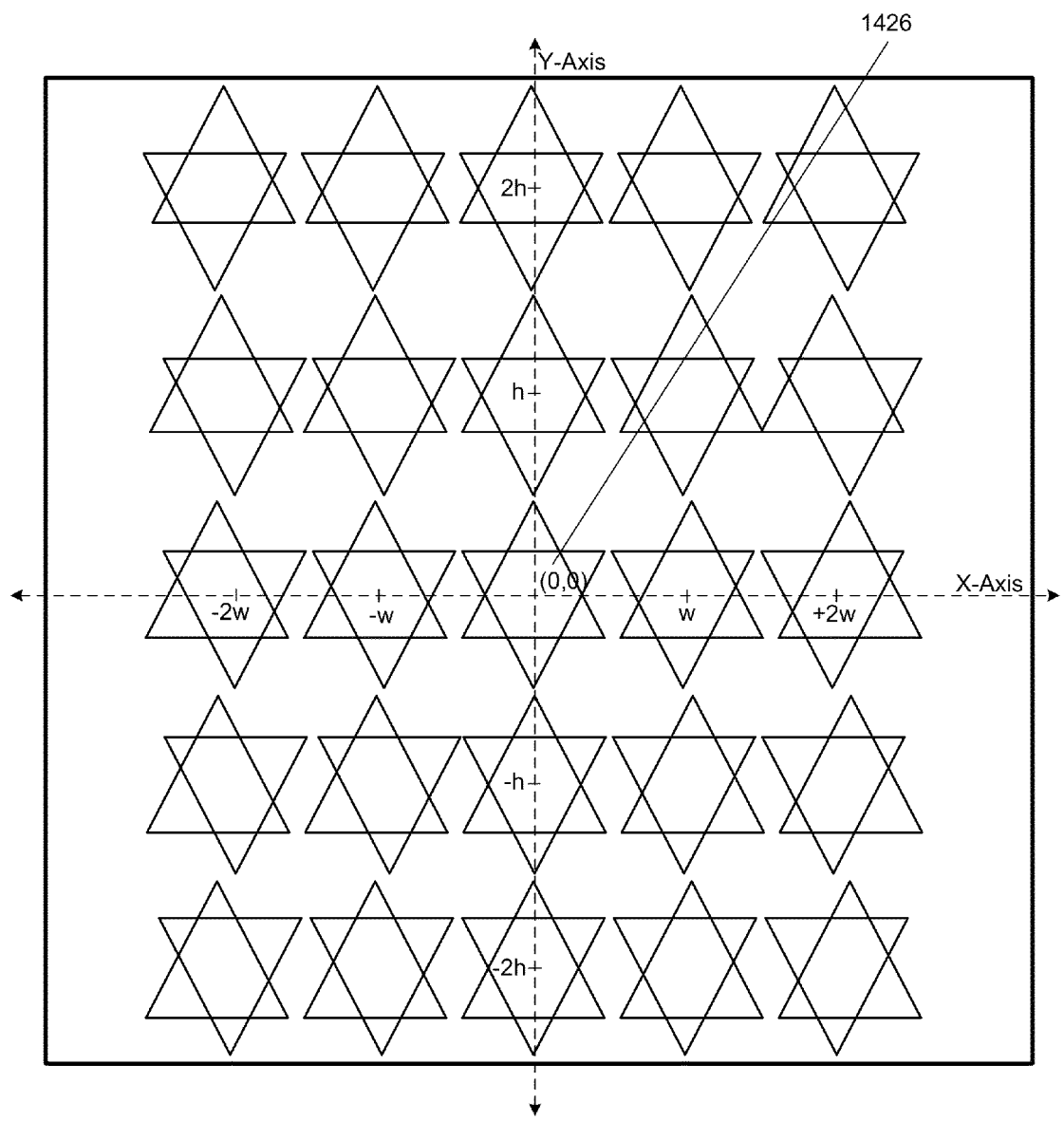
Figure 31:
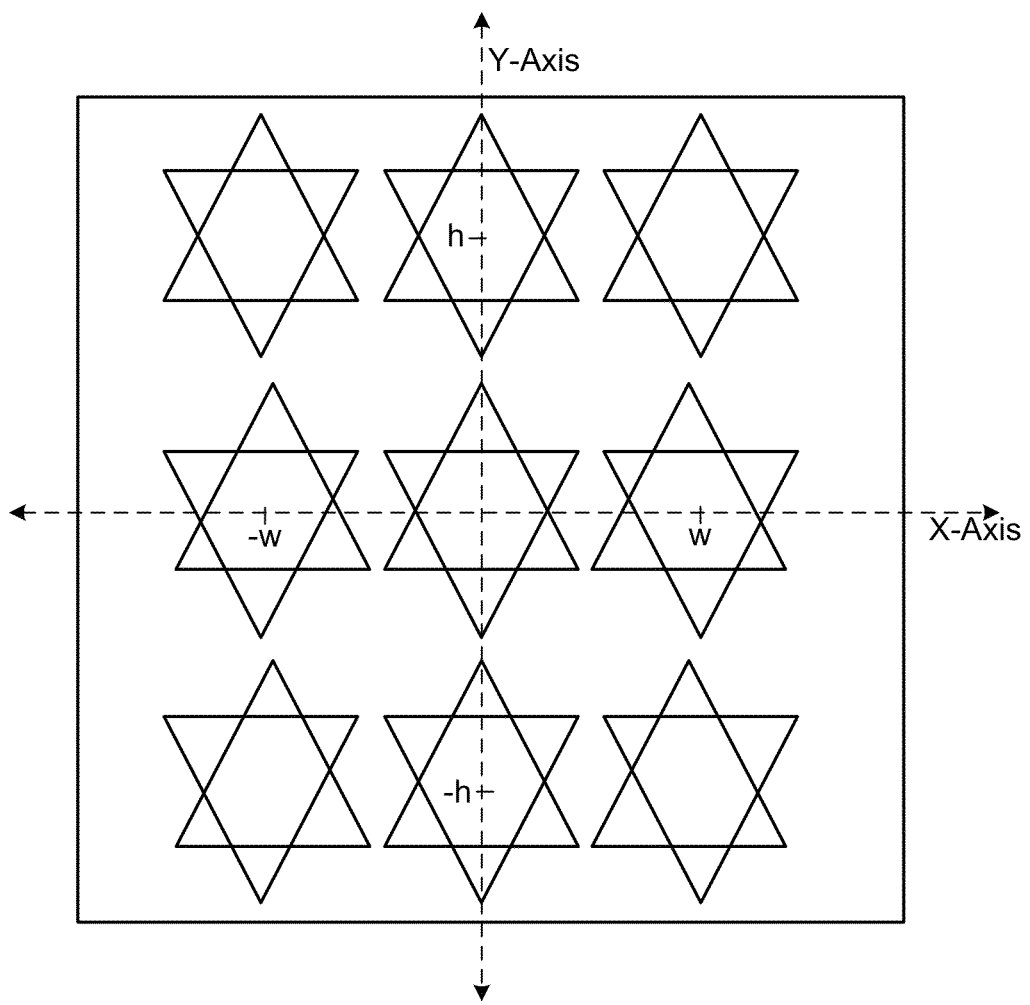

In step 705, a new imprinting step is performed with a mold having convex features that are either the same but that are displaced (either rotationally or translationally) relative to the corresponding formed recesses 2004, or that are of different shapes. An example of the previous imprint mold being rotated and aligned is shown in FIGS. 29-31. In either case, the desired result is to produce an overlay of convex shapes that when combined produce a recessed non-convex shape, as further described herein. In step 706, a second formable layer 2007 is deposited and imprinted to form new or rotated recessed convex geometrically shaped nanostructures 2008 in the formable layer 2007, as shown in FIGS. 13A and 13B. In step, 707, the recesses 2008 in the formable layer 2007 may be dry etched (e.g. Oxygen gas, or Argon with Oxygen gas plasma) to expose the metal layer 2000, which may be subsequently selectively etched using a second dry etch step (e.g. Chlorine gas or Chlorine with Oxygen gas plasma can be selectively used to etch Chromium) to form recessed convex geometrically shaped nanostructures 2011 in the formable layer 2007 and form recessed non-convex geometrically shaped nanostructures 2012 in the metal layer 2000, as shown in FIGS. 14A, 14B, 15A and 15B. A single etch step may be used to etch the formable layer 2007 and metal layer 200 to form the recessed convex geometrically shaped nanostructures 2011 in the formable layer 2010 and non-convex geometrically shaped nanostructures 2012 in the metal layer 2009. In step 708, if additional patterned recesses need to be formed in the metal layer then steps 704, 705, 706 and 707 are repeated. In step 709, once the final desired recessed non-convex geometrically shaped nanostructures pattern is obtained in the metal layer 2000, the remaining formable layer 2007 may be removed by plasma ashing (e.g. using Oxygen gas plasma), as shown in FIGS. 15A and 15B. In step 710, the substrate 2001 is selectively dry etched (e.g. Fluorine gas plasma, $CF_4$, $CHF_3$, etc.) without etching the metal layer (e.g. Chromium will not be significantly etched using a Fluorine gas plasma etch step) to a desired depth to create recessed non-convex geometrically shaped nanostructures 2014 in the substrate 2001, as shown in FIGS. 16A and 16B. In step 711, the metal layer is stripped and removed from the substrate to reveal final recessed non-convex geometrically shaped nanostructures 2014 patterned into the substrate 2001, as shown in FIGS. 17A, 17B and 17D. The metal layer may be removed by dry etching (e.g. Chlorine gas or Chlorine with Oxygen gas plasma can be selectively used to etch Chromium) or wet etching (e.g. using commercially available CR-7s, from Cyantek Corporation, Chromium can be selectively removed). Using the process embodiment detailed above, other substrates 2001a, 2001b, 2001c, 2001d and 2001e with non-convex geometrically shaped nanostructures 2014a, 2014b, 2014c, 2014d and 2014e can be created and are shown in FIGS. 18A, 18B, 18C, 18D and 18E.

In another embodiment of the process described in FIG. 7, metal layer 2000 can be replaced with a composite of a thin layer of first resist (such as resist 202 depicted in FIG. 2A) followed by an overlay of second resist (such as resist 203 depicted in FIG. 2A). For example, the second resist may include a wet strippable material, a soluble material, such as PMGI (Polymethylglutarimide), and/or the like. PMGI may be wet-stripped by tetramethylammonium hydroxide (TMAH) that may be obtained under the trade name CD260 from Shipley Company, L.L.C. (now Rohm Haas). Alternatively, the second resist may be any negative photoresist, for example poly hydroxyl styrene. Each resist layer may include an intermediate layer for adhesion purposes such as the material disclosed in U.S. Publication No. 2007/0212494. Similar to step 603 (FIG. 6), a layer of formable material 2002 may be deposited and imprinted with an imprint mold containing raised convex geometrically shaped nanostructures to form a third resist layer which has patterned recessed convex geometrically shaped nanostructures. Similar to steps 607 and 608 in FIG. 6, the formable resist layer, second resist material layer and first resist material layer 202 may be selectively dry etched (e.g., with different combination of Argon and/or Oxygen gas plasma) stopping at the substrate. Similar to step 609, the formable resist layer and the second resist layer may be stripped leaving recessed convex geometrically shaped nanostructures through the first resist down to the substrate. Similar to step 705 (FIG. 7), the imprint mold can then be changed and/or rotated and aligned (see FIGS. 29-31). Similar to step 602 (FIG. 6), an overlay of second resist may be deposited. Similar to 603 (FIG. 6), a layer of formable material (FIG. 7) may be deposited and imprinted with an imprint mold containing raised convex geometrically shaped nanostructures to form a third resist layer which has patterned recessed convex geometrically shaped nanostructures. Similar to steps 607 and 608 (FIG. 6), the formable resist layer, second resist material layer and first resist material layer may be selectively dry etched (e.g., with different combination of Argon and Oxygen gas plasma) stopping at the substrate. The first material layer will now contain recessed non-convex geometrically shaped nanostructure pattern. Similar to step 609 (FIG. 6), the formable resist layer and/or the second resist layer may be stripped leaving the recessed non-convex geometrically shaped nanostructures through the first resist down to the substrate. If recessed non-convex geometrically shaped nanostructure pattern is final then a step similar to step 612 (FIG. 6) can be used to etch selectively to desired depth into the substrate forming recessed non-convex geometrically shaped nanostructure pattern in the substrate. If the pattern is not the desired final pattern, then the above steps can be repeated. Finally a step similar to step 613 can be used to remove the first material layer to form a final substrate with just recessed non-convex geometrically shaped nanostructure pattern, such as shown in FIGS. 17A, 17B and 17D. Further, while the above processes of forming non-convex recesses in a substrate have been described using an imprint template having raised features, it will be appreciated that templates with recessed features can also be employed using reverse-tone processes to form the non-convex recesses.

Figure 8:
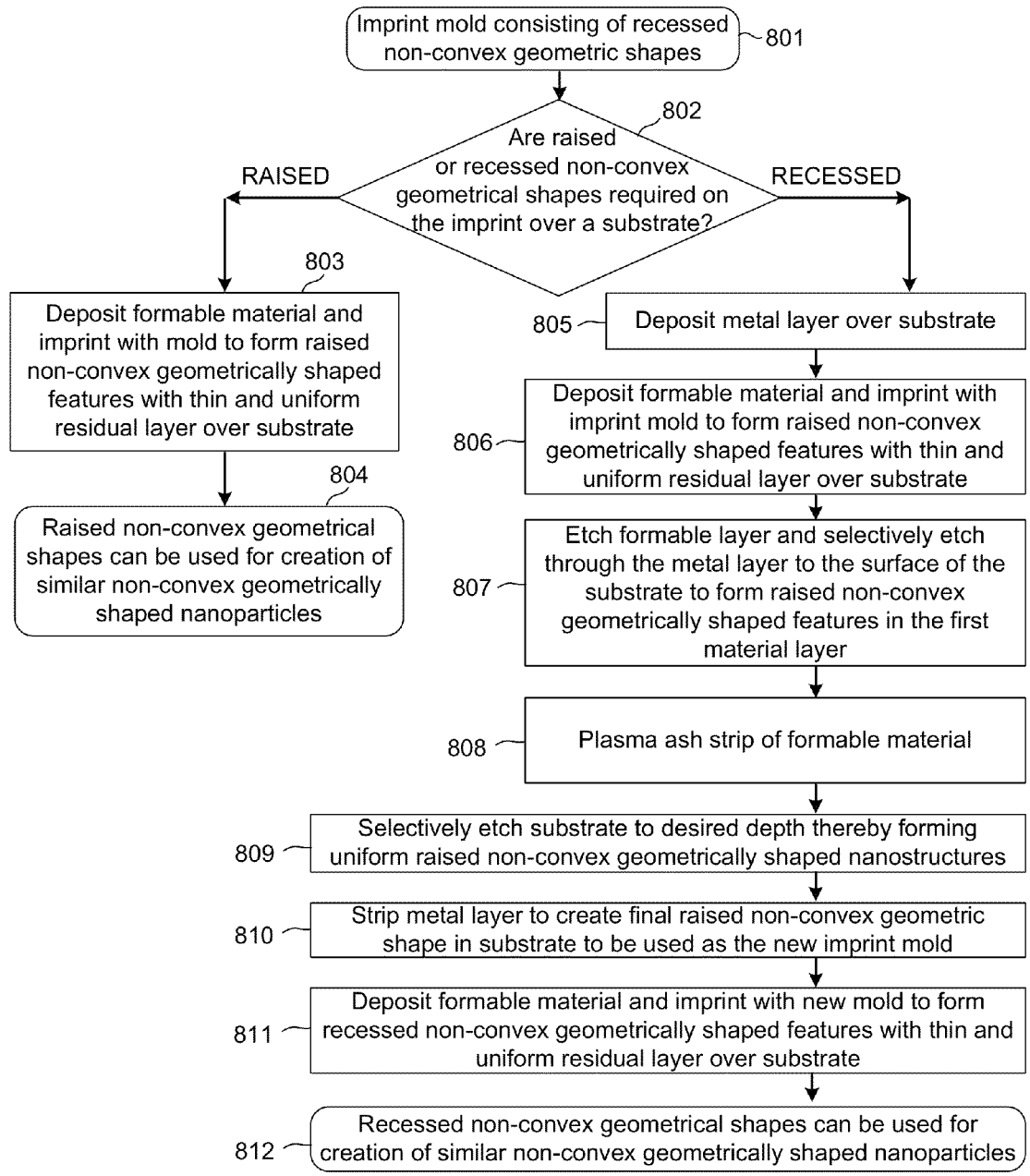
FIG. 8 illustrates a flow diagram of exemplary processes for creating non-convex nanoparticles from the substrate of FIG. 7 according to embodiments herein.
Figure 9:
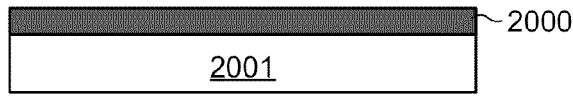
FIG. 9 illustrates a cross-section view of a substrate with a metal layer deposited over the substrate.
Figure 19:
FIG. 19 illustrates a cross-section view showing a substrate with a metal layer deposited over the substrate.
Figure 20A:
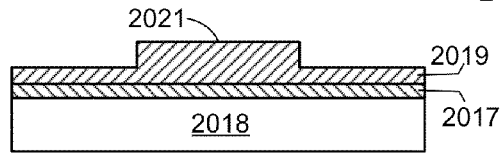
Figure 20B:
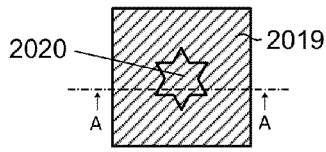
Figure 21A:
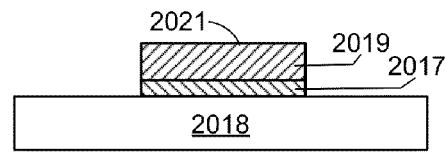
Figure 21B:
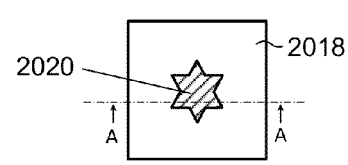
Figure 22A:
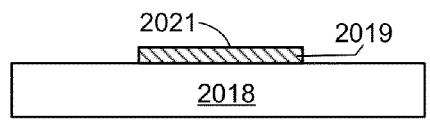
Figure 22B:
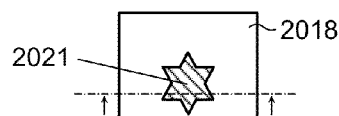
Figure 23A:
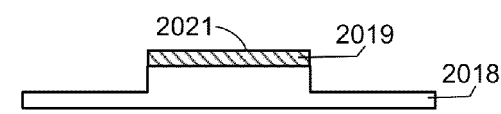
Figure 23B:
Figure 24A:
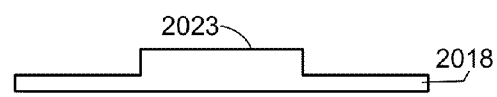
Figure 24B:
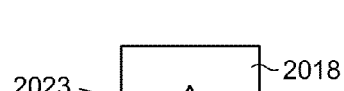
Figure 24C:
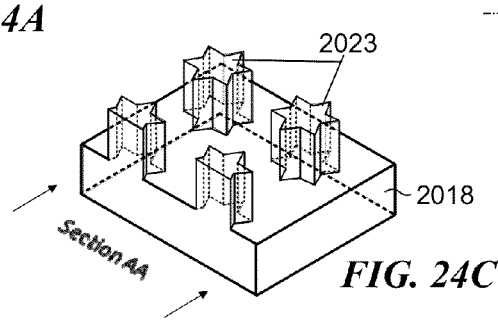
FIG. 24C illustrates a perspective, isometric view of FIGS. 24A-24B showing raised non-convex geometrically shaped nanostructures in the substrate.

An imprint mold having recessed non-convex geometrically shaped nanostructure pattern, can be used to create functional non-convex geometrically shaped nanostructures. Depending on the imprint requirement of raised or recessed non-convex geometrically shaped nanostructure patterns required in a substrate, two process paths can be followed, as shown in FIG. 8. In step 801 (FIG. 8), an imprint mold created at step 711 (FIG. 7), is selected for desired non-convex recessed geometrically shaped nanostructure pattern in the imprint mold. In step 802 (FIG. 8), a decision is made if raised or recessed non-convex geometrically shaped nanostructures are required for pursuing different processes to create functional nanoparticles (e.g. bio-functional nanoparticles for drug delivery and diagnostics in nanomedicine). For example, raised non convex geometrically shaped nanostructures are useful in processes for forming functional nanoparticles described in US Patent Application Publication No. US2011/0049096 and U.S. patent application Ser. No. 13/289,601, filed Nov. 4, 2011 and entitled "Nanoimprint Lithography Formation of Functional Nanoparticles Using Dual Release Layers", each of which is incorporated herein by reference in its entirety. An example of where recessed non-convex geometrically shaped nanostructures are useful in processes for forming functional nanoparticles is described in US Patent Application Publication No. US2011/0049096, incorporated herein by reference in its entirety. Proceed to step 803 (FIG. 8), if raised non-convex geometrical shapes are required in the imprint. In step 803, a formable material is deposited over a substrate and imprinted with an imprint mold 2013 (FIGS. 17A, 17B and 17D) having recessed non-convex geometrically shaped nanostructures 2014 (FIGS. 17A, 17B and 17D) to form raised non-convex geometrically shaped nanostructures in the formable resist with thin residual layer. In step 804 (FIG. 8), the patterns of raised non-convex geometrically shaped nanostructures over substrates can be further processed to create functional nanoparticles with non-convex geometrically shapes. If the requirement is to create recessed non-convex geometrically shaped nanostructures in the imprint resist, then proceed to step 805 (FIG. 8). In step 805 (FIG. 8), deposit metal layer 2017 (e.g. Chromium) over substrate 2018 (e.g. Quartz), as shown in FIG. 19. In step 806, deposit and imprint a formable resist layer 2019 with an imprint mold (e.g. FIGS. 17A, 17B and 17D) from step 711 (FIG. 7) and/or 801 (e.g. FIG. 8) to form raised non-convex geometrically shaped nanostructure pattern 2020 with thin residual layer in the formable resist layer 2019. In step 807, the formable layer is removed from the recesses using a dry etch step (e.g. Oxygen gas, or Argon with Oxygen gas plasma) to expose the metal layer 2017 and where the metal layer 2017 is selectively etched using a second etch step (e.g. Chlorine gas or Chlorine with Oxygen gas plasma) to form raised feature 2021 in the metal layer 2019, as shown in FIGS. 21A and 21B. A single etch step may be used to etch the formable layer 2019 and metal layer 2017 to form the raised non-convex geometrically shaped nanostructures 2021 in the metal layer 2017. In step 808, remaining formable layer may be removed using a plasma ashing step (e.g. using Oxygen gas plasma), as shown in FIGS. 22A and 22B. In step 809, the substrate 2018 is selectively dry etched (e.g. Fluorine gas plasma, $CF_4$, $CHF_3$, etc.) without etching the metal layer (e.g. Chromium will not be significantly etched using a Fluorine gas plasma etch step) to a desired depth to create raised non-convex geometrically shaped nanostructures 2023 in the substrate 2018, as shown in FIGS. 23A and 23B. In step 810, the metal layer 2021 is stripped and removed from the substrate 2018 to reveal final raised non-convex geometrically shaped nanostructures 2023 patterned into the substrate 2018, as shown in FIGS. 24A, 24B and 24C. The remaining metal layer 2019 may be removed by dry etching (e.g. Chlorine gas or Chlorine with Oxygen gas plasma can be selectively used to etch Chromium) or wet etching (e.g. using commercially available CR-7s, from Cyantek Corporation, Chromium can be selectively removed). Using the imprint mold created from step 810, in step 811 formable resist material is deposited over a substrate and imprinted to create a pattern of recessed non-convex geometrically shaped nanostructures over the substrate. In step 812, such an imprint pattern in a formable resist over a substrate is subsequently used to create functional non-convex geometrically shaped nanoparticles using processes such as those described above.

Figure 25A:
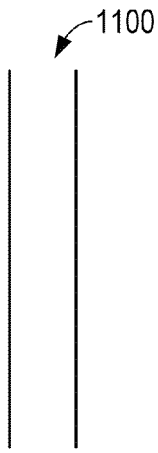
FIGS. 25A-25C illustrate a top down view of an exemplary first pattern, an exemplary second pattern, and an exemplary patterned surface formed by the first pattern and the second pattern.
Figure 25B:
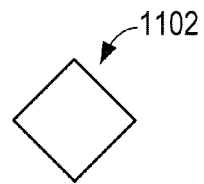
Figure 25C:
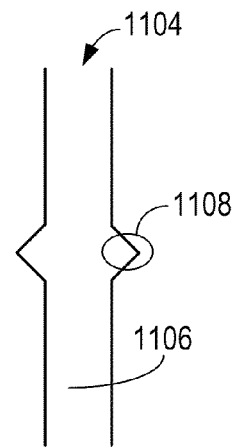

As previously described, in alternative embodiments for forming non-convex nano structures the second pattern overlaying the first pattern may be substantially different than the first pattern. For example, FIG. 25A illustrates first pattern 1100 and FIG. 25B illustrates second pattern 1102. As shown in FIG. 25C, overlay of first pattern 110 and second pattern 1102 may provide surface pattern 1104 having a plurality of non-convex nanoshapes 1106 having at least one sharp edge 1108.

Figure 26A:
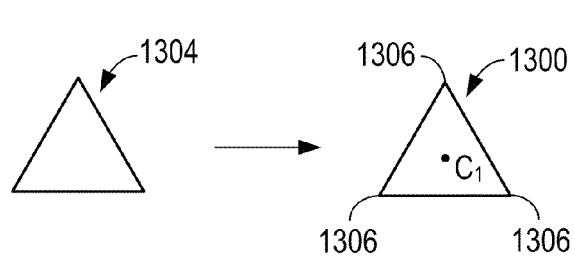
FIGS. 26A-26B illustrate a top down view of an exemplary pattern and exemplary nanostructure formed by the pattern.
Figure 26B:
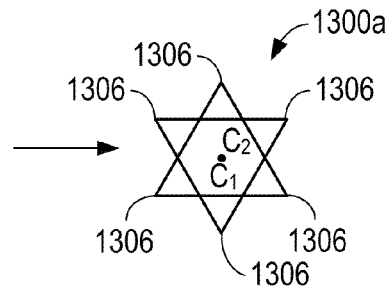

FIGS. 26A and 26B illustrate another exemplary formation of non-convex nanoshapes 1300 and 1310 having multiple sharp edges 1302. Convex template pattern 1304 (e.g., triangular pattern) may be used to form a first nanoshape 1300 having three vertices 1306 with center $C_1$. Pattern 1304 may be subsequently used again to form non-convex nanoshape 1300a having six vertices 1306 by rotating pattern 1304 approximately 180 degrees and patterning directly on nanoshape 1300, as has been previously described herein. For example, center of nanoshape 1300 having three vertices 1306 may be aligned and imprinted with center of pattern 1304, with pattern 1304 rotated approximately 180 degrees.

Alternatively, as illustrated in FIG. 26B, convex pattern 1304 (e.g., triangular pattern) may be used to form first nanoshapes 1300 having three vertices 1306. Pattern 1305 may be subsequently rotated approximately 180 degrees and aligned with vertex 1306 of nanoshapes 1300 on patterned layer 1306 forming non-convex "bow-tie" shaped nanoshapes 1310 having four vertices 1306.

Alignment of nanoshapes 1300 and 1310 may be affected in the x and y directions, but have relatively or no alignment issues with regard to $\ominus$. For example, with regard to FIG. 26A, in forming nanoshapes 1300 having six vertices, with alignment at center C, variations of $\ominus$ have little or no affect on formation.

Generally, layers within a respective print field are replicated substantially identically, resulting in substantially identical devices within each print field. Where design tolerances such as alignment or registration test limits of system, deliberate offsetting of features may provide at least one viable nanostructure that may then be replicated as needed.

FIGS. 27-31 illustrate a method for forming non-convex nanostructures using deliberate offsetting of features and provides at least one viable nanostructure that may then be replicated as needed.

Figure 27:
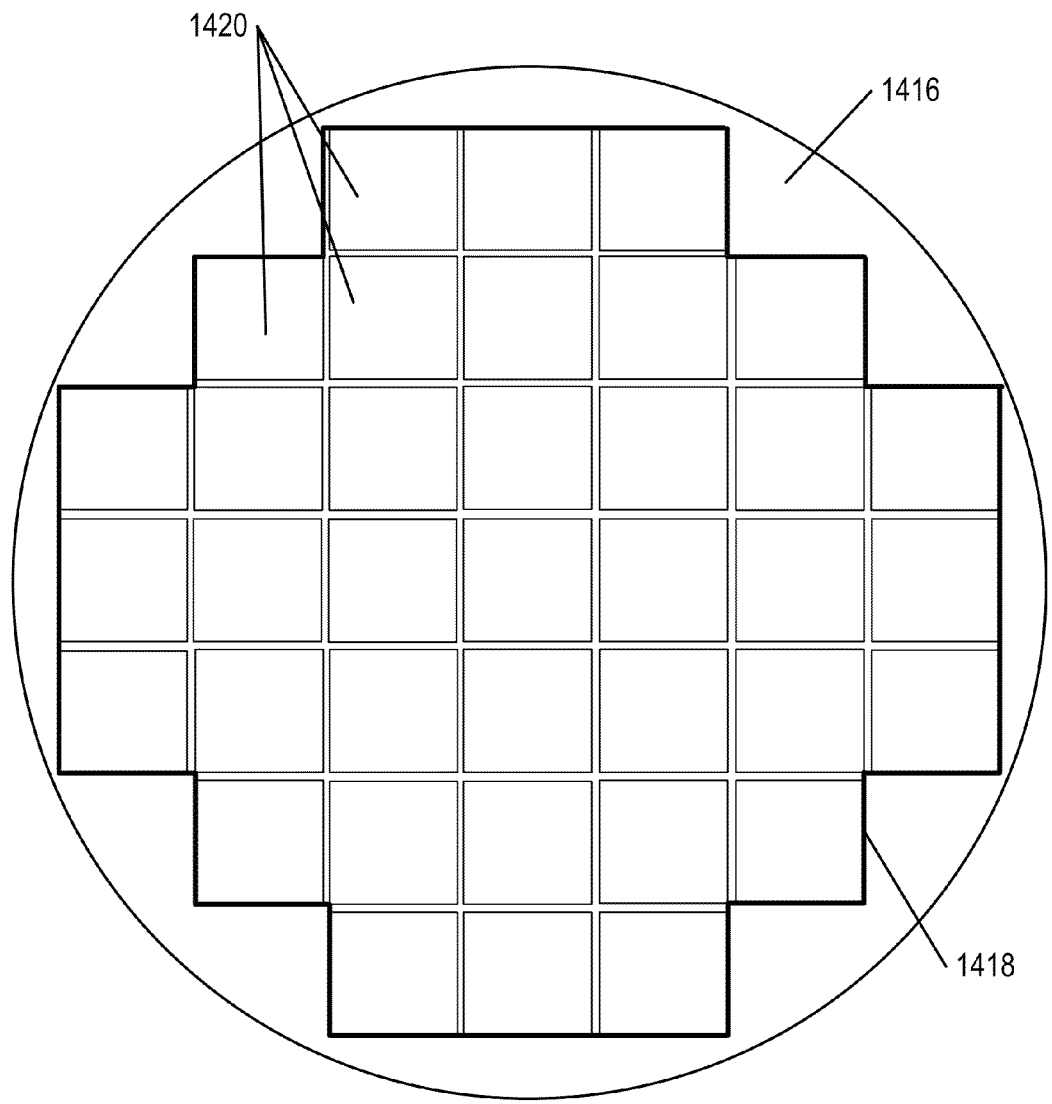
FIGS. 27-31 illustrate an exemplary method for forming nanostructures using deliberate offsetting of features.

Referring to FIG. 27, substrate 1416 may include a field 1418. Field 1418 may include multiple print fields 1420. Print fields 1420 are generally as large as a lithography system's maximum field. For example, a print field is the largest area that a lithography system can simultaneously imprint (e.g., within one flash).

Figure 28:
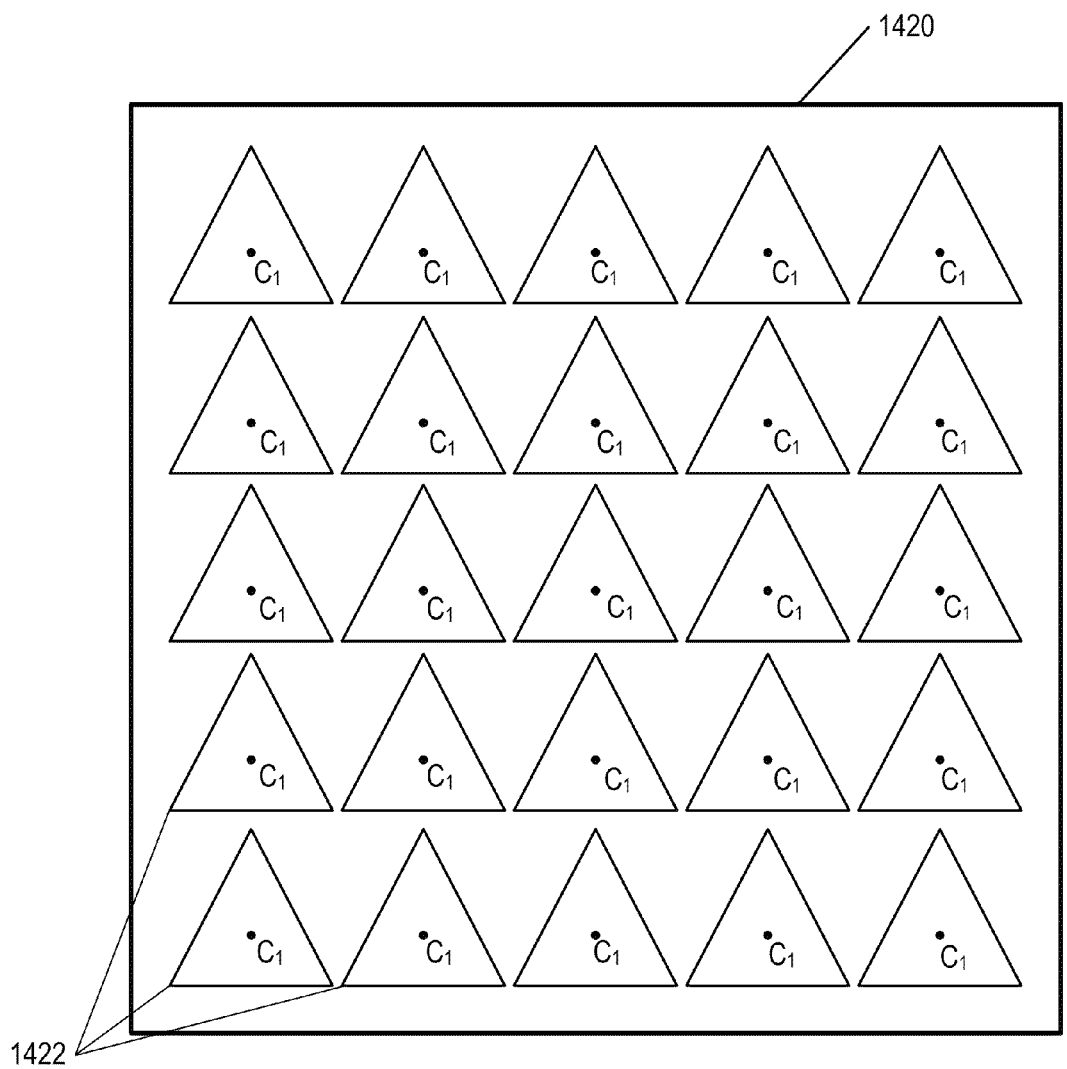

Referring to FIG. 28, print field 1420 may include multiple subfields 1422. Subfields 1422 are shown spaced a distance from the perimeter of print fields 1420; however, subfields 1422 may be positioned at the perimeter of print fields 1420. Additionally, subfields 1422 are illustrated spaced distance from each other, however, subfields 1422 may be positioned adjacent with no distance therebetween (e.g., subfields 1422 may abut each other). Each subfield 1422 may accommodate one or more functional devices (e.g., drug delivery system).

A first geometry may be created within each subfield 1422. For example, the first geometry may include convex features (e.g., triangular features). Features may have minimum feature sizes in the range of approximately 100 nm or smaller. Each first geometry may be arranged such that its features are arranged entirely within its respective subfield 1422.

In the embodiment shown, the first layer geometry (e.g., triangle) has a centermost point $C_1$ which is substantially commensurate with the centermost point of subfield 1422. Thus, in an embodiment, each first geometry may be similarly arranged within its corresponding subfield 1422. Such arrangement may be in contrast to the second geometry discussed herein.

FIG. 29 illustrates print field 1420 having second geometries 1424 imprinted upon first geometries. Each second geometry may include second features, including convex features, wherein at least one second feature has a corresponding first feature to which to align. For example, as illustrated in FIG. 26A, center $C_1$ may align with $C_2$ forming nanoshapes 1300a. In another example, as illustrated in FIG. 26B, vertex of one geometry may align with vertex of a second geometry (i.e., with geometry centers displaced or offset) forming non-convex nanoshapes 1310.

Referring again to FIG. 29, in order to provide at least one functionally aligned device, no two second geometries may be similarly arranged within their respective subfields 1422. For example, the centermost subfield 1422 may have aligned centers $C_1$ and $C_2$ of first and second geometries. However, each other subfield may include second geometries deliberately offset from first geometries. Each offset with respect to centermost point of subfield 1422 and/or first geometry may be of a set bias. Such bias may be a multiple of a set distance.

For example, bias may be a multiple of approximately 2 nm. The bias may be a function of the capability of the lithography template-making process, system, and/or apparatus. Consequently, as template manufacturing improves, bias may shrink accordingly.

FIG. 30 illustrates arrangement of first geometries and second geometries with aid of an (x, y) axis. Center $C_2$ of second-layer geometries 1426 may be arranged such that its centermost point may be substantially commensurate with the origin of axis (0, 0). Subfields may be arranged in an array having J rows and K columns. In this case, J=K=5. However, it is not required that J=K. Each column has a width 'w' and each row has a height 'h'. In this embodiment, first geometries may be spaced commensurate with subfields. Thus, first geometries may be not offset with respect to their respective subfields. Therefore, center $C_1$ of first geometry is a horizontal distance of w or a vertical distance of h from any immediately laterally adjacent first geometry. In the embodiment shown, w equals h, and centers of first geometries are substantially equally spaced from one another.

Referring to FIG. 31, centers $C_2$ of second geometries 1426 are also equally spaced. However, spacing of second geometries are not equal to spacing of first geometries. Column of second geometries have a width $w+\Delta w$ and rows have a height $h+\Delta h$. It is noted that the bias ($\Delta w$ and $\Delta h$) may be any non-zero number. For example, the bias shown in FIG. 31 may be negative. In an embodiment, a centermost subfield 1422 may be imprinted with geometries having no offset with respect to the centermost subfield, and geometries imprinted on remaining subfields have (x, y) offsets equivalent to the product of the respective bias ($\Delta w$ and $\Delta h$), and the number of rows and columns from the centermost subfield. As an example, a second geometry may be one column, zero rows from the centermost subfield. Hence, the offset of this second geometry would be ($\Delta w$, 0).

It should be noted that bias may be introduced in either geometry and is not limited to the second geometry. For example, first geometries may be biased and second geometry non-biased The resulting templates formed according to the processes described herein and having raised or recessed non-convex geometrically shaped nanostructured pattern may include the following features: (i) Corners which may be significantly sharp with at least one corner having a radius of curvature (see radius of curvature 2016 in FIG. 17C) of dimensions less than 25 nm, or less than 20 nm, or less than 10 nm, or less than 5 nm in a non-convex recess (see recess 2014 in FIGS. 17A, 17B and 17D) and/or raised non-convex feature (see raised feature 2023 in FIGS. 24A, 24B and 24C) in geometrically shaped nanostructures in created imprint molds produced by the fabrication process described herein; and/or (ii) at least one concave corner (see FIG. 17C) in the non-convex recesses 2014 (FIGS. 17A, 17B and 17D) and non-convex raised features (see FIGS. 24A, 24B and 24C) in geometrically shaped nanostructures in the created imprint molds produced by the fabrication process embodied herein.

The utility of non-convex shapes include fabrication of bio-functional nanoparticles with high surface area to volume ratios, hard disk drive thin film head GMR sensor nano-scale structures, and near-field optical apertures such as the "bow-tie" (1310) in FIG. 26 B.

Phase 3: Nano-Pattern Structure Replication

FIGS. 32A-33C illustrate side views of exemplary formation of nano-pattern structures 702. Such nano-pattern structures may have convex or non-convex cross-sectional areas as previously described. Generally, polymerizable material 34 may be deposited on the surface 706 of a substrate 708 and contacted by a nano-pattern mold 700 to form the nano-pattern structures 702 using the imprint lithography process described herein in relation to FIG. 1. The nano-pattern structures 702 may include a residual layer 712 and features (e.g. protrusions 720 and/or recessions 722) having at least one sharp edge. Residual layer 712 may have a thickness $t_R$. A thin residual layer 712 may reduce the occurrence of rounded features (e.g. protrusions 720) during subsequent processing of nano-pattern structures 702, including side edges present in non-convex cross-sectional shaped features. For example, residual layer 712 may have a thickness $t_R$ of 1-25 nm to reduce the occurrence of rounded features.

The residual layer thickness $t_R$ may be controlled by the volume of polymerizable material 34, surface energy, and/or the like. Methods for controlling residual layer thickness $t_R$ include those described in US Patent Application Publication No. US2009/0148619, incorporated herein in its entirety. Such methods can reduce and/or eliminate occurrence of rounded features and provide sharp edges during imprint lithography processes which can be important in maintaining the fidelity of pattern features imprinted by templates formed as described herein. In particular with respect to patterning non-convex features using templates formed as described herein, it may be advantageous that the residual is less than 15 nm, or in some cases less than 10 nm, or even less than 5 nm. By minimizing the thickness of the residual layer thickness, the sharp edges of e.g. non-convex geometries may be preserved through subsequent pattern transfer steps.

Figure 32A:
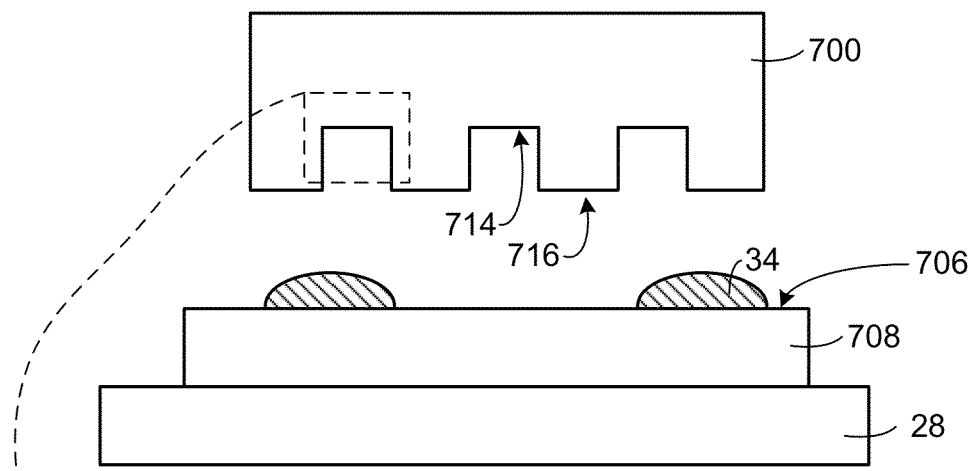
FIG. 32A illustrates a simplified cross-sectional view of a nano-pattern mold positioned above a substrate.
Figure 32B:
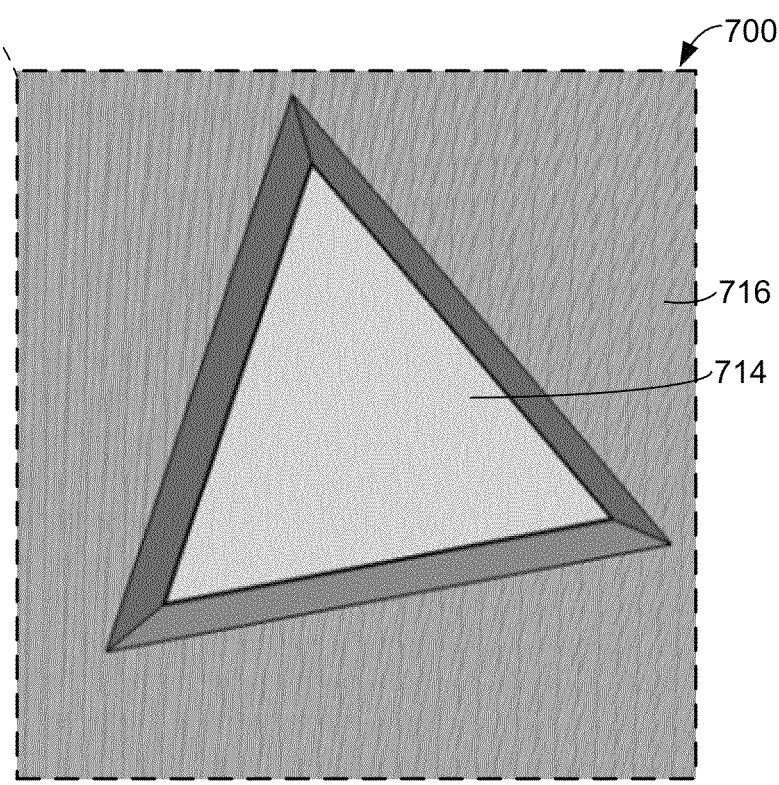
FIG. 32B illustrates a top down magnified view of a recession of the nano-pattern mold in FIG. 32A.

FIGS. 32A and 32B illustrate nano-pattern mold 700 positioned above substrate 708 having polymerizable material 34 deposited thereon. Nano-pattern mold 700 may have features (e.g., recessions 714 and/or protrusions 716). Recessions 714 and/or protrusions 716 may be formed having sharp edges using the process described herein. For example, nano-pattern mold 700 may be formed having recessions 714 in a triangular shape as illustrate in FIG. 32B. Although a triangular shape is illustrated, it should be noted that any shape having sharp edges and features may be formed including, but not limited to, rectangular, hexagonal, or any other fanciful shape.

Figure 33A:
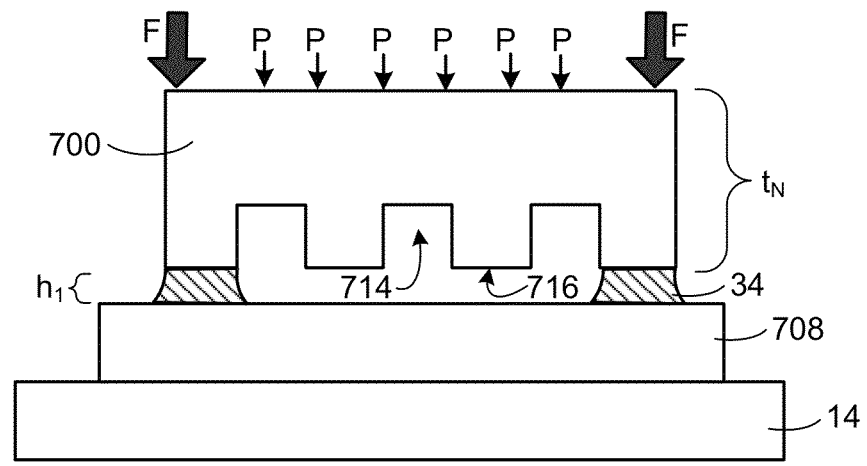
FIG. 33A illustrates a simplified cross-sectional view of a nano-pattern mold positioned above a substrate at a first height.
Figure 33B:
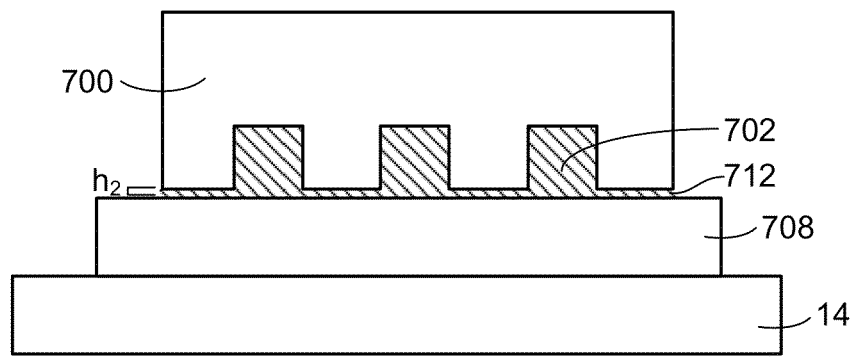
FIG. 33B illustrates a simplified cross-sectional view of a nano-pattern mold positioned above a substrate at a second height.

FIGS. 33A-33B illustrate the spread of polymerizable material 34 as nano-pattern mold 700 positioned at a height $h_1$ (FIG. 33A) moves to height $h_2$ (FIG. 33B). Nano-pattern mold 700 may have a thickness $t_N$. For example, nano-pattern mold 700 may have a thickness of 0.5 mm-10 mm.

The spreading of polymerizable material 34 during movement of the nano-pattern mold 700 from height $h_1$ to height $h_2$ is generally capillary driven with some additional applied forces. For example, an amount of force F may be provided by imprint head 38 (shown in FIG. 1) on nano-pattern mold 700 to position nano-pattern mold 700 at height h above substrate 708. The force F, however, may be minimal (e.g. 0-10 N). Additionally, chuck 28 (shown in FIG. 1) may apply pressure P. Pressure P may also be just enough to provide suitable positioning of nano-pattern mold 700 without substantial bowing or other substantial deformations. For example, pressure P may be approximately 0-0.1 atm. Minimal applied forces (e.g., force F and pressure P) may reduce deformation of the residual layer 712. Additionally, it should be noted, that chuck 14 may provide minimal force to substrate 12 to reduce deformation of residual layer 712 during formation and separation of nano-pattern structure 702.

Figure 33C:
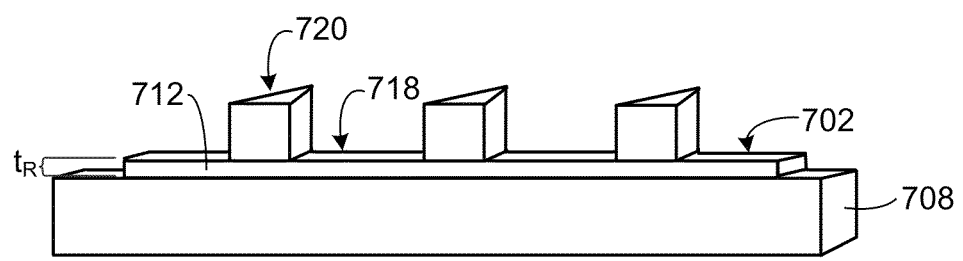

FIG. 33C illustrates the formed nano-pattern structure 702 with residual layer 712 having thickness $t_R$ and protrusions 720 having sharp edges. It should be noted that with such thin residual layers, and the fact that adhesion layers may be 1 nm thick, pattern transfer that begins with the substrate etch and no descum is enabled. To this end, an imprint pattern transfer manufacturing process may include: Vapor coat adhesion layer (1 nm thick), drop on demand resist dispense (dispense pattern and monomer volume is based on template volume calculation), imprint patterning (dummy fill if needed) with <5 nm RLT, substrate only etch (no descum), strip and clean substrate. It should be noted that if a descum etch is needed, it may be for removing a thin residual film, and as such may not impact the shape of the shaped nano-structures substantially. This may allow for etching of the substrate while retaining the nano-shapes present in the mold. This is in contrast to conventional imprint lithography wherein the following steps are taken: Vapor coat adhesion layer (1 nm thick), spin on imprint material, imprint patterning >5 nm RLT, substantial imprint resist descum (by $O_2$ plasma), substrate etch, strip and clean substrate.

Embodiments of the present invention described above are exemplary. Many changes and modifications may be made to the disclosure recited above while remaining within the scope of the invention. Therefore, the scope of the invention should not be limited by the above description, but instead should be determined with reference to any appended claims along with their full scope of equivalents.

What is claimed is:

1. A method of forming an imprint lithography template having patterning features with non-convex cross-sections, the method comprising:
    forming a first material layer on a substrate;
    forming a first patterned layer of formable material over the first material layer using an imprint lithography template having a patterning surface of features having convex geometric cross-sections;
    removing portions of the first patterned layer and the first material layer to form recesses in the first material layer having convex geometric cross-sections; forming a second patterned layer of formable material over the first layer using an imprint lithography template having a patterning surface of features having convex geometric cross-sections, wherein the template features are displaced relative to the corresponding formed recesses in the first layer;
    removing portions of the second patterned layer and the first material layer to form recesses in the first material layer having non-convex geometric cross-sections;
    etching the substrate to form recesses in the substrate having non-convex geometric cross-sections;
    removing remaining portions of the second patterned layer; and
    removing remaining portions of the first material layer, thereby forming the imprint lithography template with patterning features having non-convex cross-sections.

2. The method of claim 1 wherein the geometric cross-sections are polygonal.

3. The method of claim 1 wherein the displacement of the features relative to the corresponding recesses is a rotational displacement.

4. The method of claim 1 wherein the displacement of the features relative to the corresponding recesses is a lateral displacement.

5. The method of claim 1 wherein the features of the imprint template are raised.

6. The method of claim 1 wherein the features of the imprint template are recessed.

7. The method of claim 1 wherein the first material layer and the formable material have different etch characteristics.

8. The method of claim 1 wherein the first material layer contains a metal.

9. The method of claim 1 wherein the first material layer contains chromium.

10. A method of forming an imprint lithography template having patterning features with non-convex cross-sections, the method comprising:
    forming a first material layer on a substrate;
    forming a first patterned layer of formable material over the first material layer using an imprint lithography template having a patterning surface of features having first convex geometric cross-sections;
    removing portions of the first patterned layer and the first material layer to form recesses in the first material layer having first convex geometric cross-sections;
    forming a second patterned layer of formable material over the first layer using an imprint lithography template having a patterning surface of features having second convex geometric cross-sections, wherein the template features are aligned with the corresponding formed recesses in the first layer having first convex geometric cross-sections;
    removing portions of the second patterned layer and the first material layer to form recesses in the first material layer having non-convex geometric cross-sections;
    etching the substrate to form recesses in the substrate having non-convex geometric cross-sections;
    removing remaining portions of the second patterned layer; and
    removing remaining portions of the first material layer, thereby forming the imprint lithography template with patterning features having non-convex cross-sections.

11. The method of claim 10 wherein the geometric cross-sections are polygonal.

12. The method of claim 10 wherein the features of the imprint template are raised.

13. The method of claim 10 wherein the features of the imprint template are recessed.

14. The method of claim 10 wherein the first material layer and the formable material have different etch characteristics.

15. The method of claim 10 wherein the first material layer contains a metal.

16. The method of claim 10 wherein the first material layer contains a chromium.

* * * * *